United States Patent
Kim et al.

(10) Patent No.: US 11,928,887 B2
(45) Date of Patent: Mar. 12, 2024

(54) FOLDABLE ELECTRONIC DEVICE CAPABLE OF DETECTING FINGERPRINT THROUGH AT LEAST PART OF DISPLAY

(71) Applicant: SAMSUNG ELECTRONICS CO., LTD., Suwon-si (KR)

(72) Inventors: Jeonghoo Kim, Suwon-si (KR); Kwangsub Lee, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 3 days.

(21) Appl. No.: 17/958,977

(22) Filed: Oct. 3, 2022

(65) Prior Publication Data

US 2023/0028294 A1 Jan. 26, 2023

Related U.S. Application Data

(63) Continuation of application No. PCT/KR2021/004010, filed on Mar. 31, 2021.

(30) Foreign Application Priority Data

Apr. 3, 2020 (KR) .......................... 10-2020-0041063

(51) Int. Cl.
*G06F 1/16* (2006.01)
*G06V 40/13* (2022.01)
*H05K 5/02* (2006.01)

(52) U.S. Cl.
CPC ....... *G06V 40/1318* (2022.01); *H05K 5/0226* (2013.01)

(58) Field of Classification Search
CPC .... G06V 40/1318; H05K 5/0226; G06F 1/16; G06F 1/1618; G06F 1/1637; G06F 1/1652
See application file for complete search history.

(56) References Cited

U.S. PATENT DOCUMENTS

2015/0234507 A1* 8/2015 Chun ................. G06F 3/0416
345/173
2015/0324162 A1 11/2015 Kim et al.
(Continued)

FOREIGN PATENT DOCUMENTS

JP 3201473 U 12/2015
KR 10-2015-0128303 A 11/2015
(Continued)

OTHER PUBLICATIONS

International Search Report (PCT/ISA/210) dated Jul. 16, 2021 by the International Searching Authority in International Patent Application No. PCT/KR2021/004010.
(Continued)

*Primary Examiner* — Antonio Xavier
(74) *Attorney, Agent, or Firm* — Sughrue Mion, PLLC

(57) ABSTRACT

An electronic device includes a foldable housing including a hinge, a first housing connected to the hinge and including a first surface facing a first direction and a second surface facing a second direction opposite to the first direction, and a second housing connected to the hinge, the second housing including a third surface facing a third direction and a fourth surface facing a fourth direction opposite to the third direction, wherein the first housing and the second housing are foldable relative to each with respect to the hinge, and the first surface faces the third surface in a folded state and the third direction is the same as the first direction in an unfolded state, and a first display forming the first surface and the third surface and extending from the first surface to the third surface.

15 Claims, 15 Drawing Sheets

(56) References Cited

U.S. PATENT DOCUMENTS

| | | | |
|---|---|---|---|
| 2017/0091506 A1 | 3/2017 | Sinha et al. | |
| 2017/0192462 A1* | 7/2017 | Kim | G06F 1/1641 |
| 2017/0213065 A1 | 7/2017 | Kurasawa et al. | |
| 2018/0247100 A1 | 8/2018 | Zhu et al. | |
| 2018/0255219 A1* | 9/2018 | Ramaprakash | H04N 23/90 |
| 2019/0130085 A1 | 5/2019 | Jung et al. | |
| 2019/0302847 A1 | 10/2019 | Chen et al. | |
| 2019/0340455 A1 | 11/2019 | Jung et al. | |
| 2019/0369668 A1 | 12/2019 | Kim et al. | |

FOREIGN PATENT DOCUMENTS

| | | |
|---|---|---|
| KR | 10-2018-0081356 A | 7/2018 |
| KR | 10-2018-0123174 A | 11/2018 |
| KR | 10-2019-0137433 A | 12/2019 |

OTHER PUBLICATIONS

Written Opinion (PCT/ISA/237) dated Jul. 16, 2021 by the International Searching Authority in International Patent Application No. PCT/KR2021/004010.

* cited by examiner

FOLDABLE ELECTRONIC DEVICE CAPABLE OF DETECTING FINGERPRINT THROUGH AT LEAST PART OF DISPLAY

CROSS-REFERENCE TO RELATED APPLICATION(S)

This application is a by-pass continuation of International Application No. PCT/KR2021/004010, filed on Mar. 31, 2021, in the Korean Intellectual Property Receiving Office, which is based on and claims priority to Korean Patent Application No. 10-2020-0041063, filed on Apr. 3, 2020, in the Korean Intellectual Property Office, the disclosures of which are incorporated by reference herein in their entireties.

BACKGROUND

1. Field

The disclosure relates to a foldable electronic device capable of detecting a fingerprint through at least a part of a flexible display.

2. Description of Related Art

Electronic devices have been transformed from a uniform rectangular shape into a variety of shapes. For example, the electronic device may have a deformable structure that enables the device to be carried conveniently and a large-screen display to be used. As a type of such electronic devices, a foldable type electronic device has been released.

Recently, a technology for detecting a fingerprint through at least a part of an electronic device has been applied. The display of the electronic device may include a window made of a relatively rigid glass material, and the fingerprint sensor may be disposed to overlap with at least a part of the display.

The foldable electronic device may include a flexible display, and the flexible display may include a window made of a flexible polymer material. Since the polymer material window has a flexible characteristic and wrinkles may occur when a physical pressure is applied from the outside, difficulty may occur in using the fingerprint sensor.

SUMMARY

Provided is a foldable electronic device capable of detecting a fingerprint through at least a part of the flexible display and preventing the flexible display from wrinkling.

Additional aspects will be set forth in part in the description which follows and, in part, will be apparent from the description, or may be learned by practice of the presented embodiments.

According to an aspect of the disclosure, an electronic device may include a foldable housing including a hinge, a first housing connected to the hinge and including a first surface facing a first direction and a second surface facing a second direction opposite to the first direction, and a second housing connected to the hinge, the second housing including a third surface facing a third direction and a fourth surface facing a fourth direction opposite to the third direction, wherein the first housing and the second housing are foldable relative to each with respect to the hinge, and the first surface faces the third surface in a folded state and the third direction is the same as the first direction in an unfolded state, a first display forming the first surface and the third surface and extending from the first surface to the third surface, a second display exposed through at least a portion of the fourth surface, a circuit board provided on at least a portion of the second housing, a first fingerprint sensor provided on a front surface of the circuit board and configured to detect a fingerprint through at least a portion of the first display, and a second fingerprint sensor provided on a rear surface of the circuit board opposite to the front surface and configured to detect a fingerprint through at least a portion of the second display.

The first fingerprint sensor may at least partially overlap with the second fingerprint sensor.

The electronic device may further include a support member provided inside the foldable housing and supporting the first display, where the support member may include a transmission area formed between the first display and the first fingerprint sensor.

The first display may include a flat portion forming the first surface or the third surface, a bendable portion connected to the flat portion and configured to be folded toward the rear surface of the first display, and a first flexible printed circuit board (FPCB) connected to the bendable portion, where the first FPCB may be connected to the circuit board by a first connecting member.

The support member may further include a through hole formed in at least a portion between the first FPCB and the circuit board, where the first connecting member may connect the first FPCB and the circuit board through the through hole.

The electronic device may further include a second FPCB connected to the second display and provided on a rear surface of the second display, where the second FPCB may be connected to the circuit board by a second connecting member.

The first display may include a window, a polarizing film, a display panel, a polymer member, and a conductive member, where, in the first display, the polymer member and the conductive member may be removed from a portion at least partially overlapping with the first fingerprint sensor.

The electronic device may further include a control circuit provided on at least a portion of the circuit board and configured to drive the first fingerprint sensor and the second fingerprint sensor.

The circuit board may include a sensor printed circuit board (PCB) on which a control circuit is provided, where the circuit board may be connected to the sensor PCB.

The circuit board may include a main PCB on which a control circuit is provided.

A sensor hole may be formed in at least a portion of the main PCB, and the first fingerprint sensor and the second fingerprint sensor may be provided on the sensor hole.

The electronic device may further include a sensor light source provided on at least one of the front surface of the circuit board and the rear surface of the circuit board.

According to an aspect of the disclosure, a fingerprint sensor configured to detect a fingerprint from at least two directions may include a first fingerprint sensor provided on a front surface of a circuit board and configured to detect a fingerprint on the front surface, and a second fingerprint sensor provided on a rear surface of the circuit board that is opposite to the front surface, and configured to detect a fingerprint on the rear surface, where the first fingerprint sensor and the second fingerprint sensor may be provided in a foldable electronic device of which at least a part is foldable, and at least one of the first fingerprint sensor and the second fingerprint sensor may be further configured to detect the fingerprint based on light received through at least a part of the foldable electronic device from the at least two directions.

The circuit board may include a sensor PCB of the foldable electronic device on which a control circuit is provided, and the circuit board may be connected to a main PCB of the foldable electronic device.

The circuit board may include a main PCB of the foldable electronic device on which a control circuit is provided.

BRIEF DESCRIPTION OF DRAWINGS

The above and other aspects, features, and advantages of certain embodiments of the present disclosure will be more apparent from the following description taken in conjunction with the accompanying drawings, in which.

DETAILED DESCRIPTION

Figure 1:
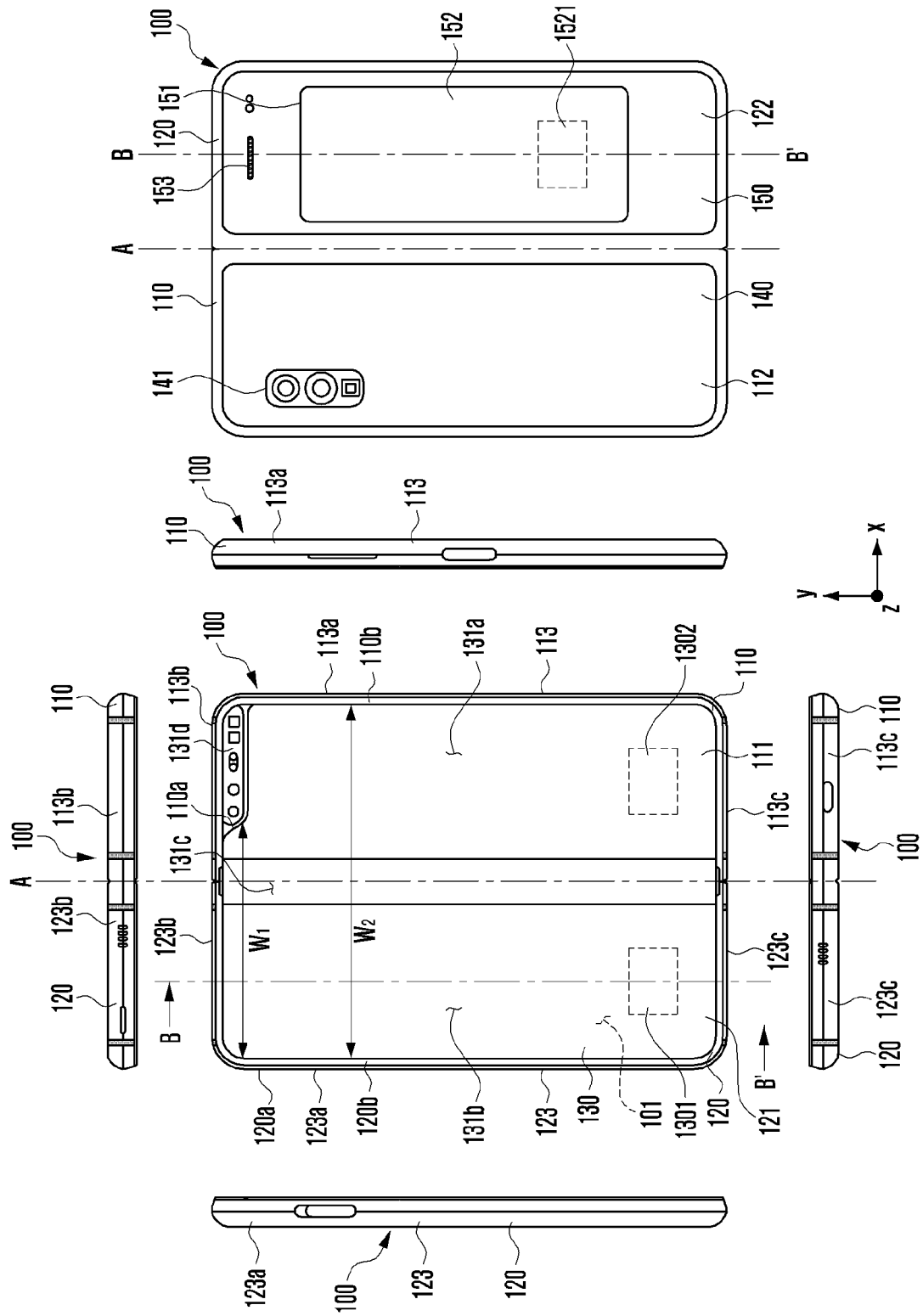
FIG. 1 is a diagram illustrating an unfolded state of an electronic device according to various embodiments of the disclosure.
Figure 2:
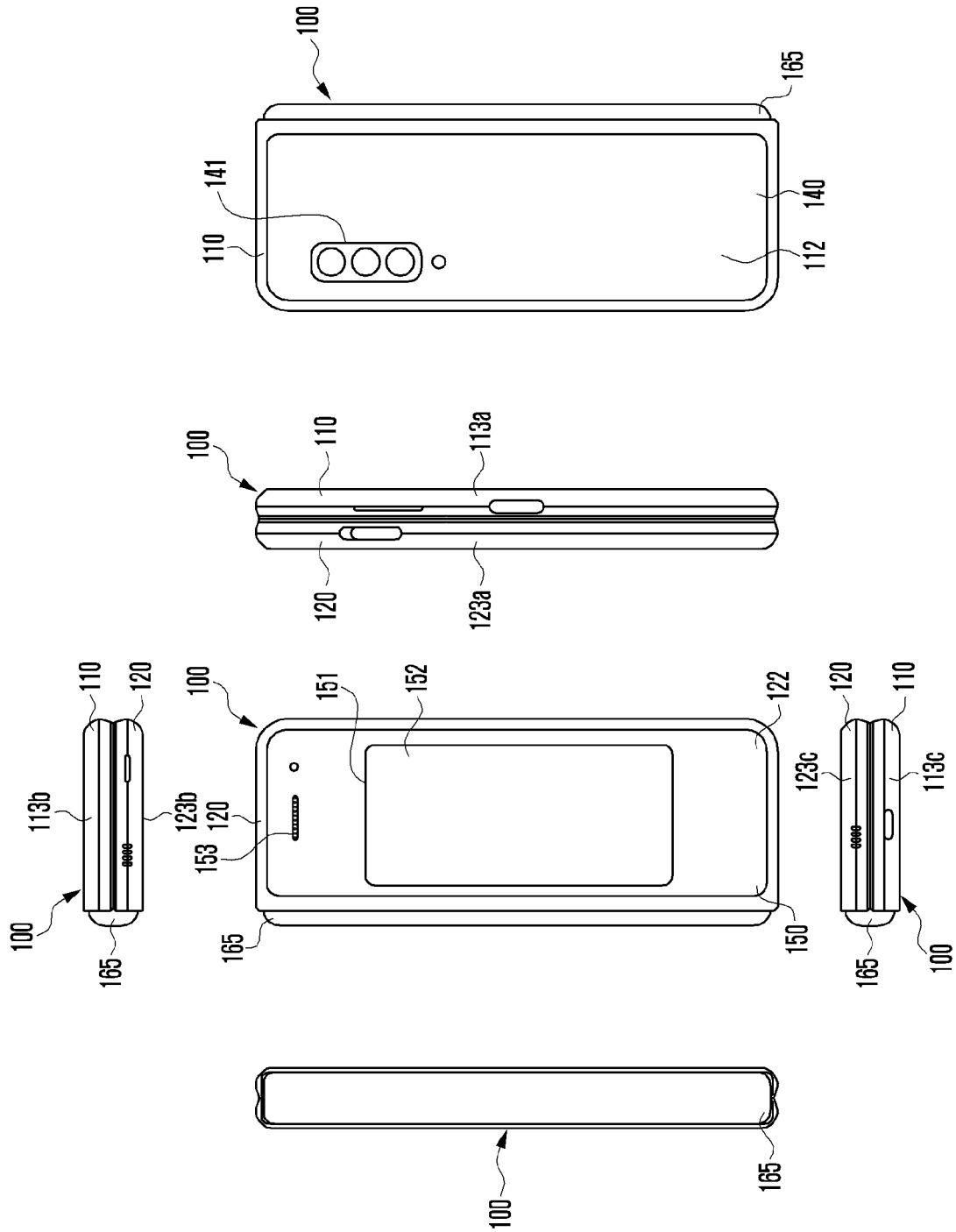
FIG. 2 is a diagram illustrating a folded state of the electronic device of FIG. 1 according to various embodiments of the disclosure.

FIG. 1 is a diagram illustrating an unfolded state of an electronic device 100 according to various embodiments of the disclosure. FIG. 2 is a diagram illustrating a folded state of the electronic device 100 of FIG. 1 according to various embodiments of the disclosure.

With reference to FIG. 1, the electronic device 100 may include a pair of housings 110 and 120 (e.g., the foldable housing) that are rotatably coupled through a hinge (e.g., the hinge 164 of FIG. 3) to be folded with respect to each other, a hinge cover (e.g., the hinge cover 165 of FIG. 2) that covers the foldable portion of the pair of housings 110 and 120, and the display 130 (e.g., a flexible display, a foldable display, or a first display) disposed on the space formed by the pair of housings 110 and 120. In this document, the surface on which the display 130 is disposed may be defined as the front surface of the electronic device 100, and the opposite surface of the front surface may be defined as the rear surface of the electronic device 100. In addition, a surface surrounding the space between the front and rear surfaces may be defined as a side surface of the electronic device 100.

In an embodiment, the pair of housings 110 and 120 may include a first housing 110 that includes a sensor area 131d, a second housing 120, a first back cover 140, and a second back cover 150. The pair of housings 110 and 120 of the electronic device 100 are not limited to the shape and combination shown in FIGS. 1 and 2, and they may be implemented by a combination and/or coupling of other shapes or parts. For example, in another embodiment, the first housing 110 and the first back cover 140 may be integrally formed, and the second housing 120 and the second back cover 150 may be integrally formed.

According to an embodiment, the first housing 110 and the second housing 120 may be disposed on opposite sides centered on the folding axis (A axis), and they may have a substantially symmetrical shape as a whole with respect to the folding axis (A axis). According to an embodiment, the first housing 110 and the second housing 120 may have different angles or distances formed from each other depending on whether the electronic device 100 is in an unfolded state (e.g., a flat state or a closing state), a folded state (e.g., a folding state), or an intermediate state. According to an embodiment, the first housing 110 additionally may include a sensor area 131d in which various sensors are disposed, unlike the second housing 120, but it may have a mutually symmetrical shape in other areas. In another embodiment, the sensor disposed area 131d may be additionally disposed or replaced with at least a partial area of the second housing 120.

In an embodiment, the first housing 110 may be connected to a hinge (e.g., the hinge 164 of FIG. 3) in an unfolded state of the electronic device 100, and it may include the first surface 111 disposed to face the front of the electronic device 100, the second surface 112 facing the opposite direction of the first surface 111, and the first side member 113 surrounding at least a portion of the space between the first surface 111 and the second surface 112. In an embodiment, the first side member 113 may include a first side surface 113a disposed in parallel to the folding axis (A axis), a second side surface 113b extended from one end of the first side surface 113a in a direction perpendicular to the folding axis, and a third side surface 113c extended from the other end of the first side surface 113a in a direction perpendicular to the folding axis (A axis).

In an embodiment, the second housing 120 may be connected to a hinge (e.g., the hinge 164 of FIG. 3) in an unfolded state of the electronic device 100, and it may include the third surface 121 disposed to face the front of the electronic device 100, the fourth surface 122 facing the opposite direction of the third surface 121, and the second side member 123 surrounding at least a portion of the space between the third surface 121 and the fourth surface 122. In an embodiment, the second side member 123 may include a fourth side surface 123a disposed in parallel to the folding axis (axis A), a fifth side surface 123b extended from one end of the fourth side surface 123a in a direction perpendicular to the folding axis (A axis), and a sixth side surface 123c extended from the other end of the fourth side surface 1231 in a direction perpendicular to the folding axis (A axis). In an embodiment, the third surface 121 may face the first surface 111 in a folded state.

In an embodiment, the electronic device 100 may include a recess 101 formed to accommodate the display 130 through the structural shape coupling of the first housing 110 and the second housing 120. The recess 101 may have substantially the same size as the display 130. In an embodiment, due to the sensor area 131d, the recess 101 may have two or more different widths in a direction perpendicular to the folding axis (A axis). For example, the recess 101 may have the first width (W1) between the first portion 120a parallel to the folding axis (A axis) of the second housing 120 and the second portion 110a formed at the edge of the sensor area 131d of the first housing 110, and the second width (W2) formed by the third portion 120b of the second housing 120 and the fourth portion 110b that is not part of sensor area 113d of the first housing and parallel to the folding axis (A axis). In this case, the second width W2 may be formed to be longer than the first width W1. For example, the recess 101 may be formed to have a first width (W1) formed from the second portion 110a of the first housing 110 having a mutually asymmetric shape to the first portion 120a of the second housing 120, and it may be formed to have a second width W2 formed from the fourth portion 110b of the first housing 110 having a mutually symmetrical shape to the third portion 120b of the second housing 120. In an embodiment, the second portion 110a and the fourth portion 110b of the first housing 110 may be formed to have different distances from the folding axis (A axis). The width of the recess 101 is not limited to the illustrated example. In various embodiments, the recess 101 may have two or more different widths due to the shape of the sensor area 131d or the portion having the asymmetric shape of the first housing 110 and the second housing 120.

In an embodiment, at least a portion of the first housing 110 and the second housing 120 may be formed of a metal material or a non-metal material having a rigidity in a selected size to support the display 130.

In an embodiment, the sensor area 131d may be formed to have a preset area adjacent to one corner of the first housing 110. However, the arrangement, shape, and size of the sensor area 131d are not limited to the illustrated example. For example, in another embodiment, the sensor area 131d may be provided in another corner of the first housing 110 or in an arbitrary area between the upper corner and the lower corner. In another embodiment, the sensor area 131d may be disposed in at least a partial area of the second housing 120. In another embodiment, the sensor area 131d may be disposed to extend to the first housing 110 and the second housing 120. In an embodiment, the electronic device 100 may be components for performing various functions arranged to be exposed on the front surface of the electronic device 100 through the sensor area 131d or through one or more openings provided in the sensor area 131d. In various embodiments, the components may include, for example, at least one of a camera device (e.g., camera module 182 of FIG. 3), a receiver, a proximity sensor, an illuminance sensor, an iris recognition sensor, an ultrasonic sensor, or an indicator.

In an embodiment, the first back cover 140 may be disposed on the second surface 112 of the first housing 110 and may have a substantially rectangular periphery. In an embodiment, at least a portion of the edge may be surrounded by the first housing 110. Similarly, the second back cover 150 may be disposed on the fourth surface 122 of the second housing 120, and at least a portion of an edge thereof may be surrounded by the second housing 120.

In the illustrated embodiment, the first back cover 140 and the second back cover 150 may have a substantially symmetrical shape with respect to the folding axis (A axis). In another embodiment, the first back cover 140 and the second back cover 150 may include a variety of different shapes. In another embodiment, the first back cover 140 may be integrally formed with the first housing 110, and the second back cover 150 may be integrally formed with the second housing 120.

In an embodiment, the first back cover 140, the second back cover 150, the first housing 110, and the second housing 120 may provide a space, through a structure coupled to each of them in which various components (e.g., a printed circuit board (PCB), an antenna module, sensor module, or a battery) of the electronic device 100 may be disposed. In an embodiment, one or more components may be disposed or visually exposed on the rear surface of the electronic device 100. For example, one or more components or sensors may be visually exposed through the first rear area 141 of the first back cover 140. In various embodiments, the sensor may include a proximity sensor, a camera device (e.g., the camera module 182 of FIG. 3), and/or a flash. In another embodiment, at least a portion of the sub-display 152 (e.g., the second display) may be visually exposed through the second rear area 151 of the second back cover 150. In another embodiment, the electronic device 100 may include a speaker module 153 disposed through at least a partial area of the second back cover 150.

The display 130 may be disposed in a space formed by the pair of housings 110 and 120. For example, the display 130 may be seated in a recess 101 formed by a pair of housings 110 and 120, and it may be placed to occupy substantially most of the front surface of the electronic device 100. Accordingly, the front surface of the electronic device 100 may include the display 130 and a partial area (e.g., an edge area) of the first housing 110 and a partial area (e.g., an edge area) of the second housing 120 that are adjacent to the display 130. In an embodiment, the rear surface of the electronic device 100 may include a first back cover 140, a partial area (e.g., an edge area) of the first housing 110 adjacent to the first back cover 140, a second back cover 150, and a partial area (e.g., an edge area) of the second housing 120 adjacent to the second back cover 150.

In an embodiment, the display 130 may refer to a display in which at least a partial area may be deformed into a flat surface or a curved surface. In an embodiment, the display 130 may include a folding area 131c, a first area 131a disposed on one side (e.g., a right area of the folding area 131c) with respect to the folding area 131c, and a second area 131b disposed on the other side (e.g., a left area of the folding area 131c). For example, the first area 131a may be disposed on the first surface 111 of the first housing 110, and the second area 131b may be disposed on the third surface 121 of the second housing 120. In an embodiment, the division of areas of the display 130 is exemplary, and the display 130 may be divided into a plurality of areas (e.g., four or more, or two) according to a structure or function. For example, in the embodiment shown in FIG. 1, the area of the display 130 may be divided by the folding area 131c extending parallel to the y-axis or the folding axis (A-axis), but in another embodiment, the display 130 may be divided into areas on the basis of another folding area (e.g., a folding area parallel to the x-axis) or another folding axis (e.g., a folding axis parallel to the x-axis). The above-described area division of the display is only a physical division by a pair of housings 110 and 120 and a hinge (e.g., the hinge 164 of FIG. 3), and substantially one full screen may be displayed on the display 130 through a pair of housings 110 and 120 and a hinge (e.g., the hinge 164 of FIG. 3). In an embodiment, the first area 131a and the second area 131b may have a substantially symmetrical shape with respect to the folding area 131c. However, unlike the second area 131b, the first area 131a may include a notch area cut according to the presence of the sensor area 131d (e.g., the notch area 133 of FIG. 3), but it may have a substantially symmetrical shape to the second area 131b in other areas (e.g., areas other than the notch area). For example, the first area 131a and the second area 131b may include a portion having a shape symmetrical to each other and a portion having a shape asymmetrical to each other.

In an embodiment, each of the display 130 (e.g., the first display) and the sub-display 152 (e.g., the second display) may include a fingerprint sensing area.

The fingerprint sensing area is, for example, an area in which fingerprint sensors (or fingerprint sensor modules) 1301, 1302, and 1521 are embedded, and the fingerprint sensors 1301, 1302, and 1521 may be disposed to overlap with the display 130 and/or the sub-display 152 seen from the z-axis direction.

In an embodiment, the fingerprint sensors 1301, 1302, and 1521 may include a first fingerprint sensor 1301 that detects a fingerprint through at least a portion of the display 130 forming the third surface 121 and a second fingerprint sensor 1521 that detects a fingerprint through at least a portion of the sub-display 152. The first fingerprint sensor 1301 and the second fingerprint sensor 1521 may be disposed, for example, in the inner space of the second housing 120 and may be disposed to overlap each other. In an embodiment, the first fingerprint sensor 1301 and the second fingerprint sensor 1521 may be mounted to a single circuit board (e.g., the second PCB 830 of FIG. 8), thereby securing a mounting space and reducing the thickness of the electronic device 100.

In an embodiment, the fingerprint sensors 1301, 1302, and 1521 may include a first fingerprint sensor 1301 that detects a fingerprint through at least a portion of the display 130 forming the third surface 121, a second fingerprint sensor 1521 that detects a fingerprint through at least a portion of the sub-display 142, and/or a third fingerprint sensor 1302 that detects a fingerprint through at least a portion of the display 130 forming the first surface 111. The first fingerprint sensor 1301 and the second fingerprint sensor 1521 may be disposed, for example, in the inner space of the second housing 120 and may be disposed to overlap each other, and the third fingerprint sensor 1302 may be disposed in the inner space of the first housing 110. In an embodiment, the electronic device 100 may control the operations of the first fingerprint sensor 1301, the second fingerprint sensor 1521, and/or the third fingerprint sensor 1302 through at least one controller (or control circuit). For example, the first controller may control the first fingerprint sensor 1301 and the second fingerprint sensor 1521, and the second controller may control the third fingerprint sensor 1302. In addition, the first controller may control the first fingerprint sensor 1301 and the third fingerprint sensor 1302, and the second controller may control the second fingerprint sensor 1512.

In an embodiment, a structure in which the first fingerprint sensor 1301 and the second fingerprint sensor 1521 are mounted to a circuit board will be described in detail later with reference to FIGS. 8 to 15.

Figure 3:
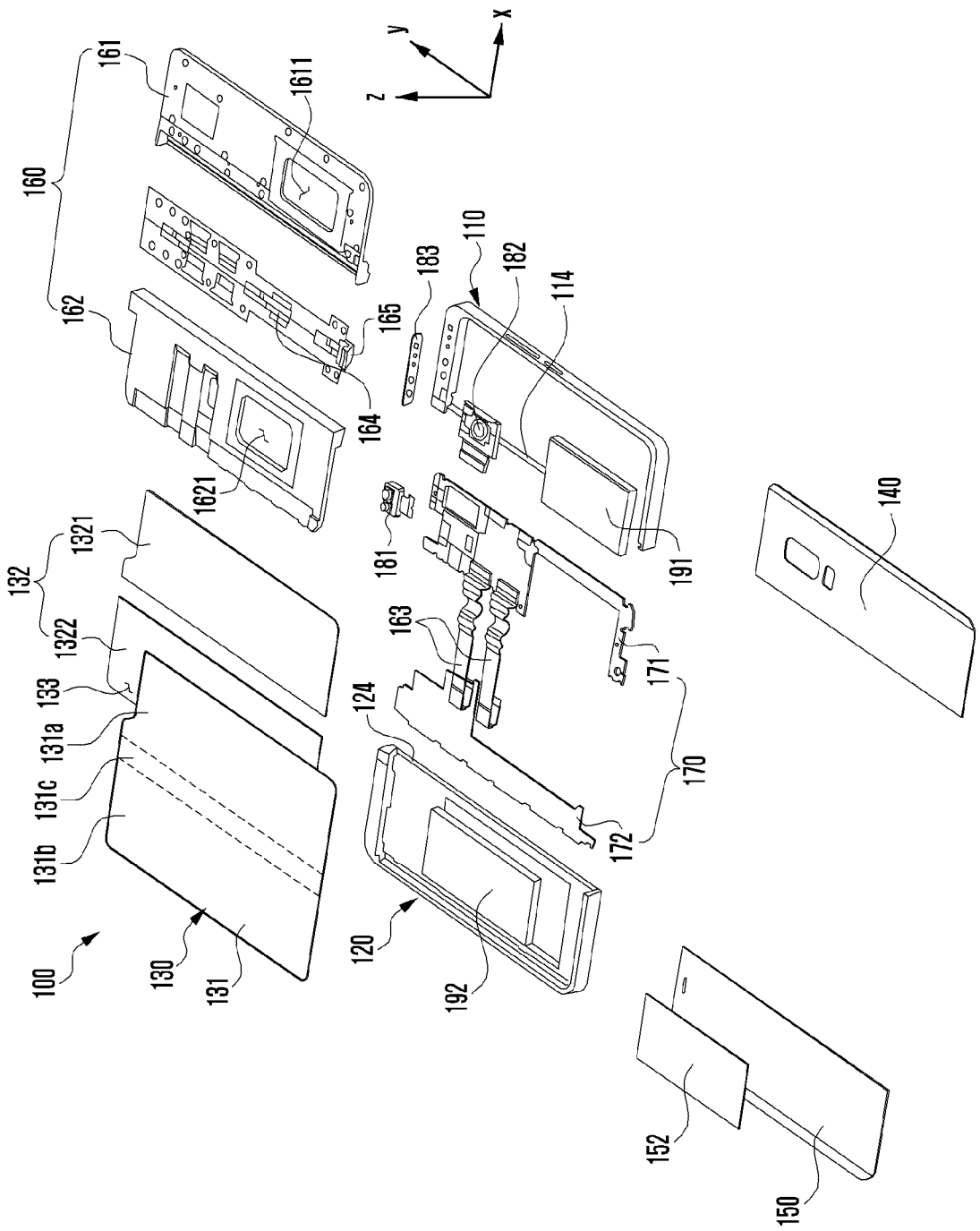
FIG. 3 is a diagram of an electronic device according to various embodiments of the disclosure.

With reference to FIG. 2, a hinge cover 165 may be disposed between the first housing 110 and the second housing 120 to cover internal components (e.g., the hinge 164 of FIG. 3). In an embodiment, the hinge cover 165 may be covered by a part of the first housing 110 and/or the second housing 120 or exposed to the outside according to an operating state (e.g., a flat state or a folded state) of the electronic device 100. At least one of the components of the electronic device 100 of FIG. 2 may be similar to at least one of the components of the electronic device 100 of FIG. 1, and hereinafter below redundant description will be omitted.

As an example, as shown in FIG. 1, in the case that the electronic device 100 is in an unfolded state, the hinge cover 165 may not be exposed because it is covered by the first housing 110 and the second housing 120. For example, as shown in FIG. 2, in the case that the electronic device 100 is in a folded state (e.g., a completely folded state), the hinge cover 165 may be exposed to the outside between the first housing 110 and the second housing 120. As an example, in the case that the first housing 110 and the second housing 120 are in an intermediate state that is folded with a certain angle, the hinge cover 165 may be at least partially exposed to the outside of the electronic device 100 between the first housing 110 and the second housing 120. In this case, the exposed area may be smaller than that of the fully folded state. In an embodiment, the hinge cover 165 may include a curved surface.

Hereinafter, the operation of the first housing 110 and the second housing 120 are described in accordance with the operating state of the electronic device 100 (e.g., a flat state and a folded state) and each area of the display 130.

In an embodiment, in the case that the electronic device 100 is in a flat state (e.g., the state of FIG. 1), the first housing 110 and the second housing 120 may be at a first angle (e.g., about 180) and the first area 131a and the second area 131b of the display may be disposed to face substantially the same direction. In addition, the folding area 131c may form a substantially coplanar surface with the first area 131a and the second area 131b. In another embodiment, in the case that the electronic device 100 is in a flat state, the first housing 110 and the second housing 120 may be folded to the opposite direction so that the second surface 112 and the fourth surface 122 may face each other by rotating at a second angle (e.g., about 360 degrees) with respect to each other.

In an embodiment, in the case that the electronic device 100 is in a folded state (e.g., the state of FIG. 2), the first housing 110 and the second housing 120 may be disposed to face each other. The first area 131a and the second area 131b of the display 130 may form a narrow angle (e.g., between about 0 and 10 degrees) and face each other. The folding area 131c may be formed, for example, as a curved surface, at least a portion of which has a preset curvature.

In an embodiment, in the case that the electronic device 100 is in an intermediate state, the first housing 110 and the second housing 120 may be at a certain angle (e.g., about 90 degrees) from each other. For example, the first area 131a and the second area 131b of the display 130 may form an angle larger than that in the folded state and smaller than that in the unfolded state. The folding area 131c, for example, may be formed of at least a portion of a curved surface having a preset curvature, and the curvature at this time may be smaller than that in a folded state.

FIG. 3 is a diagram of an electronic device 100 according to various embodiments of the disclosure. At least one of the components of the electronic device 100 of FIG. 3 may be similar to at least one of the components of the electronic device 100 of FIG. 1 or the electronic device 100 of FIG. 2, and hereinafter below redundant explanation will be omitted.

With reference to FIG. 3, in an embodiment, the electronic device 100 may include a display 130, a support member assembly 160 (or a support member), at least one PCB 170, a first housing 110, a second housing 120, a first back cover 140, and a second back cover 150. In this document, the display 130 (e.g., the first display) may be referred to as a display module or a display assembly.

In an embodiment, the display 130 may include a display panel 131 (e.g., a flexible display panel) and one or more plates 132 or layers on which the display panel 131 is mounted. In an embodiment, the plate 132 may be disposed between the display panel 131 and the support member assembly 160. A display panel 131 may be disposed on at least a portion of one surface of the plate 132. The plate 132 may include a first plate 1321 and a second plate 1322 divided on the basis of the hinge 164. The plate 132 may include at least one member that cannot be folded together in the case that the first housing 110 and the second housing 120 are rotated to the folded and/or unfolded state with respect to the hinge 164. The plate 132 may include at least one auxiliary material layer (e.g., a graphite member) and/or a conductive plate (e.g., a Cu sheet) disposed on the rear surface of the display panel 131. In an embodiment, the plate 132 may be formed in a shape corresponding to the display panel 131. For example, a partial area of the first plate 1321 may be formed in a shape corresponding to the notch area 133 of the display panel 131.

In an embodiment, the support member assembly 160 may include a first support member 161 (e.g., a first support plate), a second support member 162 (e.g., a second support plate), a hinge 164 disposed between the first support member 161 and the second support member 162, the hinge cover 165 covering the hinge 164 when viewed from the outside, and at least a wiring member 163 (e.g., a flexible printed circuit board (FPCB)) crossing the first support member 161 and the second support member 162.

In an embodiment, the support member assembly 160 may be disposed between the plate 132 and the at least one PCB 170. As an example, the first support member 161 may be disposed between the first area 131a of the display 130 and the first PCB 171. The second support member 162 may be disposed between the second area 131b of the display 130 and the second PCB 172.

In an embodiment, at least a portion of the wiring member 163 and the hinge 164 may be disposed inside the support member assembly 160. The wiring member 163 may be disposed in a direction (e.g., the x-axis direction) crossing the first support member 161 and the second support member 162. The wiring member 163 may be disposed in a direction (e.g., the x-axis direction) perpendicular to the folding axis (e.g., the y-axis or the folding axis A of FIG. 1) of the folding area 131c.

In an embodiment, the first PCB 170, as mentioned above, may include the first PCB 171 disposed on the first support member 161 side and the second PCB 172 disposed on the second support member 162 side. The first PCB 171 and the second PCB 172 may be disposed inside the space formed by the support member assembly 160, the first housing 110, the second housing 120, the first back cover 140, and the second back cover 150. The components for implementing various functions of the electronic device 100 may be mounted to the first PCB 171 and the second PCB 172.

In an embodiment, the first space of the first housing 110 may include the first PCB 171 disposed in the space formed through the first support member 161, the first battery 191 disposed at the position facing the first swelling hole 1161 of the first support member 161, at least one sensor module 181 or at least one camera module 182. The first housing 110 may include a window glass 183 disposed to protect the at least one sensor module 181 and the at least one camera module 182 at a position corresponding to the notch area 133 of the display 130. In an embodiment, the second space of the second housing 120 may include the second PCB 172 disposed in the second space formed through the second support member 162 and the second battery 192 disposed on the position facing the second swelling hole 1621 of the second support member 162. According to an embodiment, the first housing 110 and the first support member 161 may be integrally formed. According to an embodiment, the second housing 120 and the second support member 162 may also be integrally formed. According to an embodiment, the sub-display 152 may be disposed in the second space of the second housing 120. According to an embodiment, the sub-display 152 (e.g., the second display) may be disposed to be visible from the outside through at least a partial area of the second back cover 150.

In an embodiment, the first housing 110 may include a first rotation support surface 114, and the second housing 120 may include a second rotation support surface 124 corresponding to the first rotation support surface 114. The first rotation support surface 114 and the second rotation support surface 124 may include curved surfaces corresponding to the curved surfaces included in the hinge cover 165.

In an embodiment, the first rotation support surface 114 and the second rotation support surface 124 may cover the hinge cover 165 in the case that the electronic device 100 is in an unfolded state (e.g., the state of FIG. 1) so that the cover 165 may not be exposed or minimally exposed to the rear surface of the electronic device 100. In an embodiment, the first rotation support surface 114 and the second rotation support surface 124 may enable the hinge cover 165 to be maximally exposed to the rear surface of the electronic device 100 by rotating along the curved surface included in the hinge cover 165 in the case that the electronic device 100 is in a folded state (e.g., the state of FIG. 2).

Figure 4:
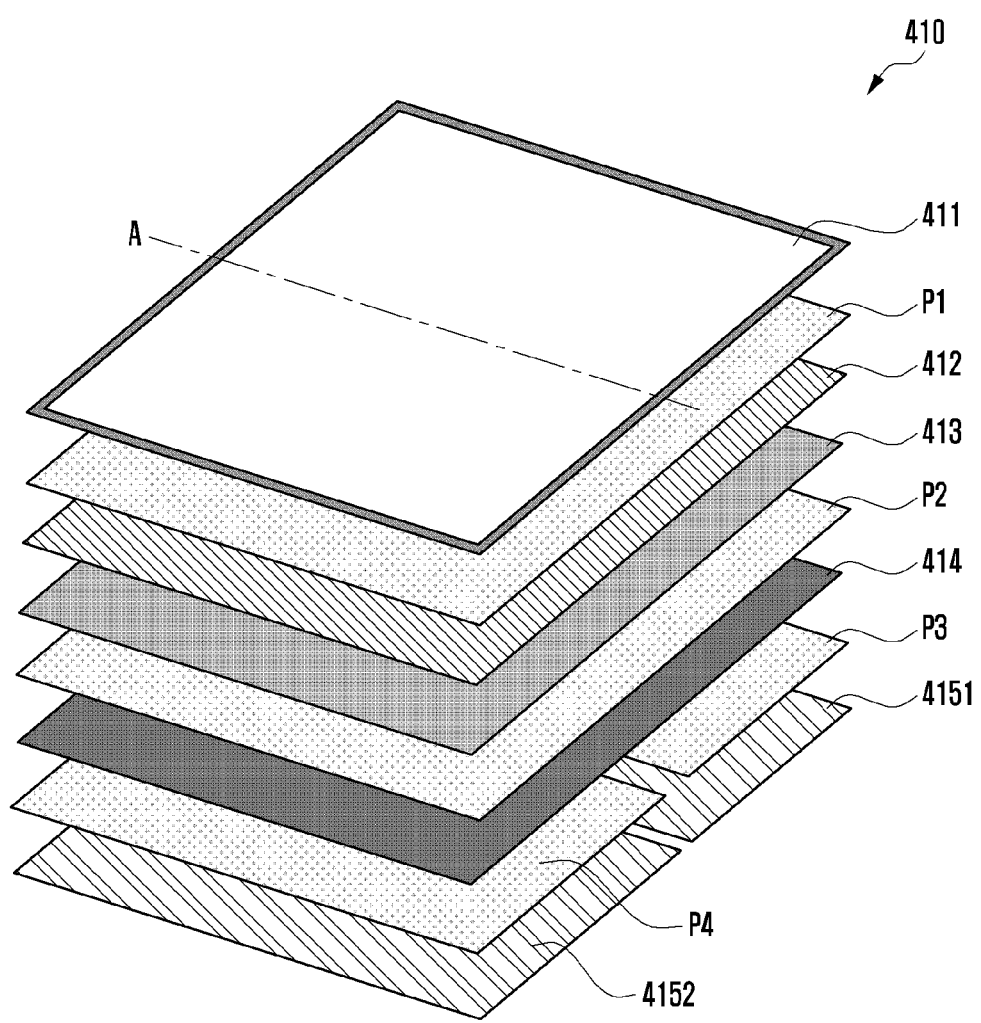
FIG. 4 is a diagram illustrating a stacked structure of a first display according to various embodiments of the disclosure.

FIG. 4 is a diagram illustrating a stacked structure of the first display 410 according to various embodiments of the disclosure.

The first display 410 of FIG. 4 may further include the embodiments that are at least partially similar to or different from the display 130 of FIG. 3.

With reference to FIG. 4, according to various embodiments, the first display 410 may include a window 411 (e.g., polyimide (PI) film) and a polarizer (POL) 412 (e.g., a polarizing film) sequentially disposed on the rear surface of the window 411, a display panel 413, a polymer member 414, and a pair of conductive members 4151 and 4152. According to an embodiment, the window 411, the POL 412, the display panel 413, and/or the polymer member 414 may be configured by being disposed crossing at least a portion of the first surface (e.g., the first surface 111 of FIG. 1) of the first housing (e.g., the first housing 110 of FIG. 1) and the third surface (e.g., the third surface 121 of FIG. 1) of a second housing (e.g., the second housing 120 of FIG. 1) so that the folding area facing the hinge (e.g., the hinge 164 of FIG. 3) may be foldable according to the folding or unfolding operations of the electronic device (e.g., the electronic device 100 of FIG. 1). According to an embodiment, a pair of conductive members 4151 and 4152 that have the feature of not being bent may include the first conductive member 4151 disposed in an area facing the first housing 110 except the folding area and the second conductive member 4152 disposed in an area facing the second housing 120. According to an embodiment, the window 411, the POL 412, the display panel 413, the polymer member 414, and the pair of conductive members 4151 and 4152 may be attached to one another through the adhesive members P1, P2, P3, and P4. For example, the adhesive members P1, P2, P3, and P4 may include at least one of an optical clear adhesive (OCA), a pressure sensitive adhesive (PSA), a heat-reactive adhesive, a general adhesive, and a double-sided tape.

According to various embodiments, a dark color (e.g., black) may be applied to the polymer member 414 to help display the background in the case that the display is turned off. According to an embodiment, the polymer member 414 may act as a cushion for preventing the first display 410 from being damaged by absorbing an impact from the outside of the electronic device.

According to an embodiment, the pair of conductive members 4151 and 4152 are metal plates and may help to reinforce rigidity of an electronic device, shield against ambient noise, and be used to distribute the heat emitted from surrounding heat dissipating components. According to an embodiment, the conductive members 4151 and 4152 may include at least one of Cu, Al, stainless steel (SUS), or CLAD (e.g., a stacked member in which SUS and Al are alternately disposed). According to an embodiment, the first conductive member 4151 and the second conductive member 4152 may be attached to the polymer member 414 through the adhesive members P3 and P4. In this case, since the two adhesive members P3 and P4 are disposed to have a larger distance than the distance between the two conductive members 4151 and 4152, in the case that the two conductive members 4151 and 4152 are folded, mutual interference and/or intrusion into the folding area may be prevented.

According to various embodiments, the first display 410 may include at least one functional member disposed between the polymer member 414 and the conductive members 4151 and 4152. According to an embodiment, the functional member may include a graphite sheet for heat dissipation, an added display, a poster touch FPCB, a fingerprint sensor FPCB, an antenna radiator for communication, a heat dissipation sheet, a conductive/non-conductive tape, or an open cell sponge. According to an embodiment, the functional member may be disposed in an area from the first housing 110 to at least a portion of the second housing 120 through the hinge 164 in the case that the functional member is bendable. In another embodiment, in the case that bending is impossible, the functional member may be disposed individually in each of the area facing the first housing 110 and the area facing the second housing 120, except for the folding area facing the hinge 164. In another embodiment, the first display 410 may further include a detection member for detecting an input by a writing member with the electromagnetic induction method. According to an embodiment, the detection member may include a digitizer.

In an embodiment, in the first display 410, stacked structures (e.g., a polymer member 414 and a pair of conductive members 4151 and 4152) disposed under the display panel 413 may increase the transmittance of the corresponding area by being removed (or patterned) from a portion of the area overlapping with the fingerprint sensor. For example, the stacked structures disposed under the display panel 413 may be removed (or patterned) from at least a portion of the area (or the overlapping area) where the first fingerprint sensor 1301, the second fingerprint sensor 1521, and/or the third fingerprint sensor 1302 shown in FIG. 1 are included.

Figure 5:
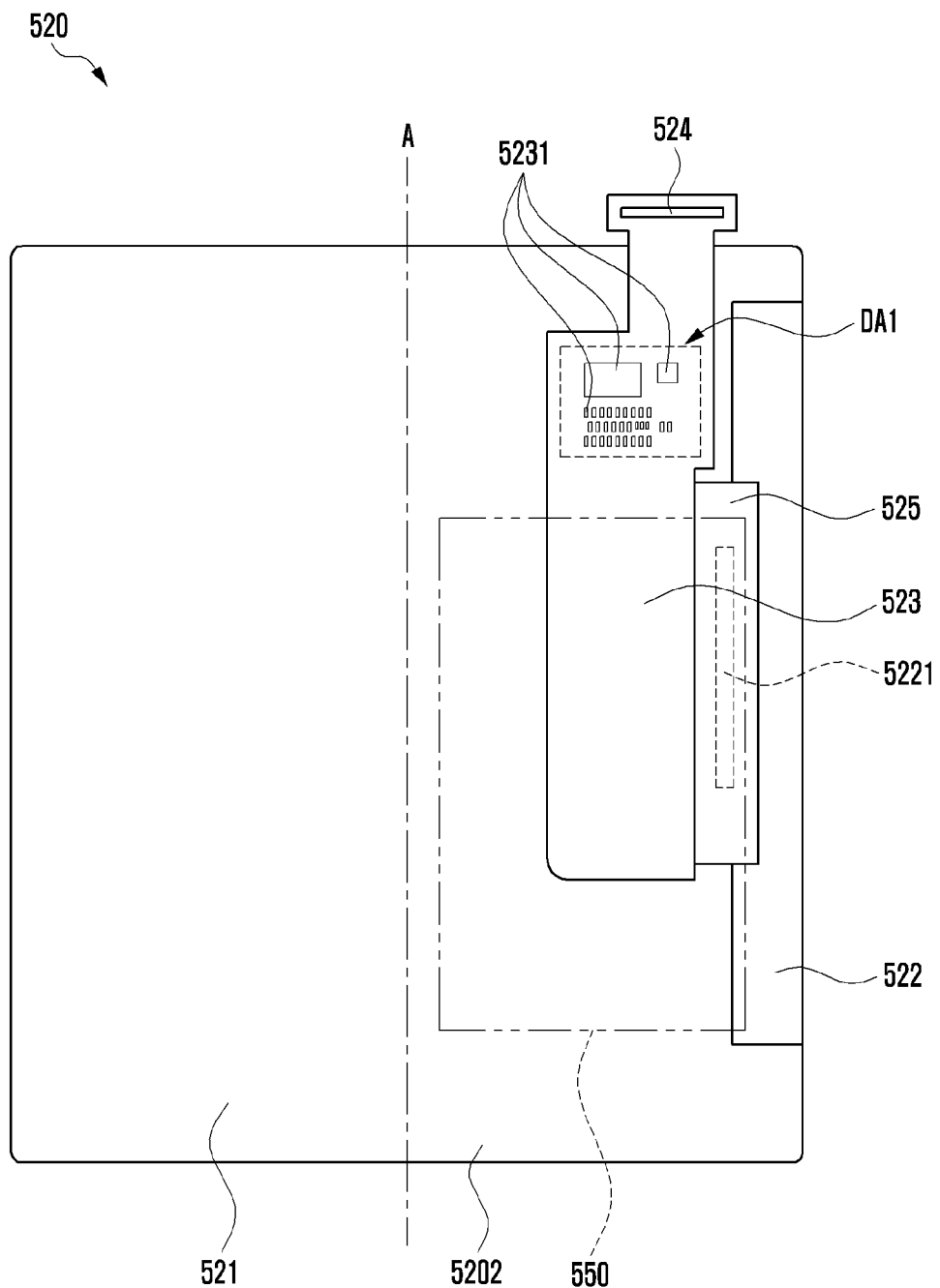
FIG. 5 is a diagram illustrating a rear structure of a first display according to various embodiments of the disclosure.

FIG. 5 is a diagram illustrating a rear structure of the first display 520 according to various embodiments of the disclosure.

The first display 520 of FIG. 5 may further include the embodiments that are at least partially similar to or different from the display 130 of FIG. 1 or the first display 410 of FIG. 4.

With reference to FIG. 5, the first display 520 may include a flat portion 521; a bendable portion 522 extending from the flat portion 521 and bending to be folded toward the rear surface 5202 of the first display 520; a connection pad 525 connected electrically to the bendable portion 522 and having an electrical wiring structure including a control circuit 5221; and a first FPCB 523 electrically connected to the connection pad 525. According to an embodiment, the first display 520 may include a flexible display that may be folded to face itself on the basis of the axis A. According to an embodiment, the control circuit 5221 may include, for example, a display driver IC (DDI) or a touch display driver IC (TDDI) mounted to a connection pad 525 having an electrical wiring structure. According to an embodiment, the connection pad 525 may include a separate FPCB or film including the control circuit 5221 disposed in a chip on film (COF) method. In another embodiment, the control circuit 5221 may have a chip on panel (COP) structure mounted to the bendable portion 522 without the connection pad 525. According to an embodiment, the first FPCB 523 may include the first element arrangement area DA1 to which the plurality of elements 5231 are mounted and a connector 524 disposed at an end of the first FPCB and electrically connected to a second PCB (e.g. the second PCB 172 of FIG. 3) of the electronic device (e.g., the electronic device 10 of FIG. 3). According to an embodiment, the plurality of elements 5231 may include a touch IC, a flash memory for a display, a diode for preventing electrostatic discharge (ESD), or a passive element such as a decap. In another embodiment, in the case that the bendable portion 522, the connection pad 525, and the first FPCB 523 are displaced at the area facing the first housing (e.g., the first housing 110 of FIG. 1) of the first display 520, the connector 524 may be electrically connected to the first PCB (e.g., the first PCB 171 of FIG. 3) of the electronic device (e.g., the electronic device 100 of FIG. 1). According to an embodiment, at least a portion of the first FPCB 523 may overlap with the second battery 550 (e.g., the second battery 192 of FIG. 3). For example, the second battery 550 may be disposed to overlap with the first FPCB 523 but not to overlap with the first element arrangement area DA1 of the first FPCB 523 in which the plurality of elements 5231 are mounted.

Figure 6:
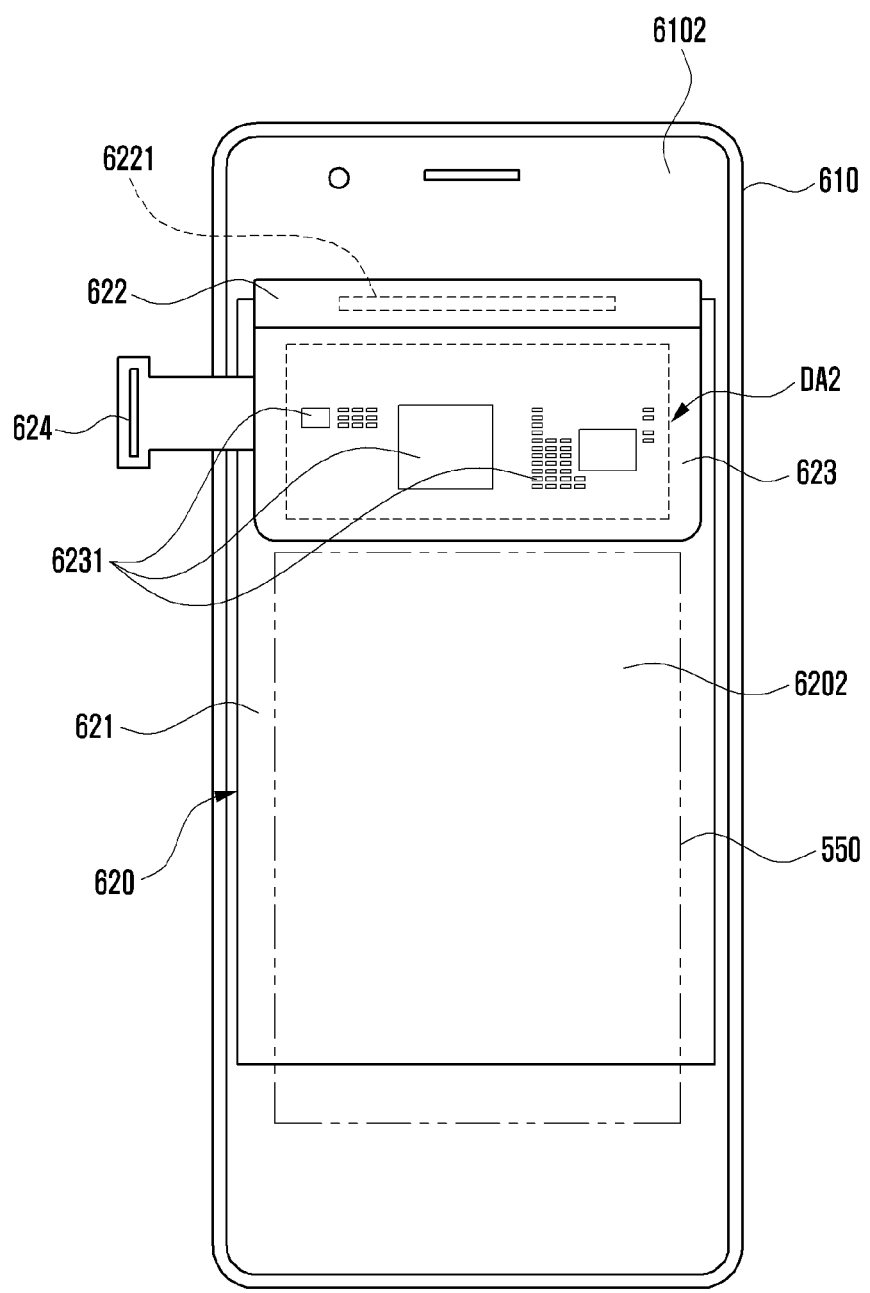
FIG. 6 is a diagram illustrating a rear structure of a second display according to various embodiments of the disclosure.

FIG. 6 is a diagram illustrating a rear structure of the second display 620 according to various embodiments of the disclosure.

The second display 620 of FIG. 6 may further include the embodiments that are at least partially similar to or different from the sub-display 152 of FIG. 1.

With reference to FIG. 6, the second display 620 may be disposed on the rear surface 6102 of the second back cover 610 (e.g., the second back cover 150 of FIG. 3) to be visible from the outside through at least a part of the second display 620. According to an embodiment, the second display 620 may include a flat portion 621, a bendable portion 622 to be folded from the flat portion 621 toward the rear surface 6202 of the second display 620, and the second FPCB 623 electrically connected to the bendable portion 622. According to an embodiment, the second display 620 may include a control circuit 6221 mounted to the bendable portion 622. According to an embodiment, the control circuit 6221 may include a DDI or a TDDI mounted to the bendable portion 622. According to an embodiment, the control circuit 6221 (e.g., DDI or TDDI) may have a COP structure mounted to the bendable part 622. According to an embodiment, the second FPCB 623 may include the second element arrangement area DA2 to which the plurality of elements 6231 are mounted, and a connector 624 drawn out to be electrically connected from the second FPCB and electrically connected to a second PCB (e.g., the second PCB 172 of FIG. 3) of the electronic device (e.g., the electronic device 100 of FIG. 3). According to an embodiment, a plurality of elements 6231 may include a touch IC, a flash memory for a display, and passive elements such as a diode or a decap for preventing ESD. According to an embodiment, at least a portion of the second display 620 may overlap with a second battery 550 (e.g., the second battery 192 of FIG. 3). For example, the second battery 550 may be disposed to overlap with the second display 620, but it does not overlap with the second FPCB 623.

Figure 7:
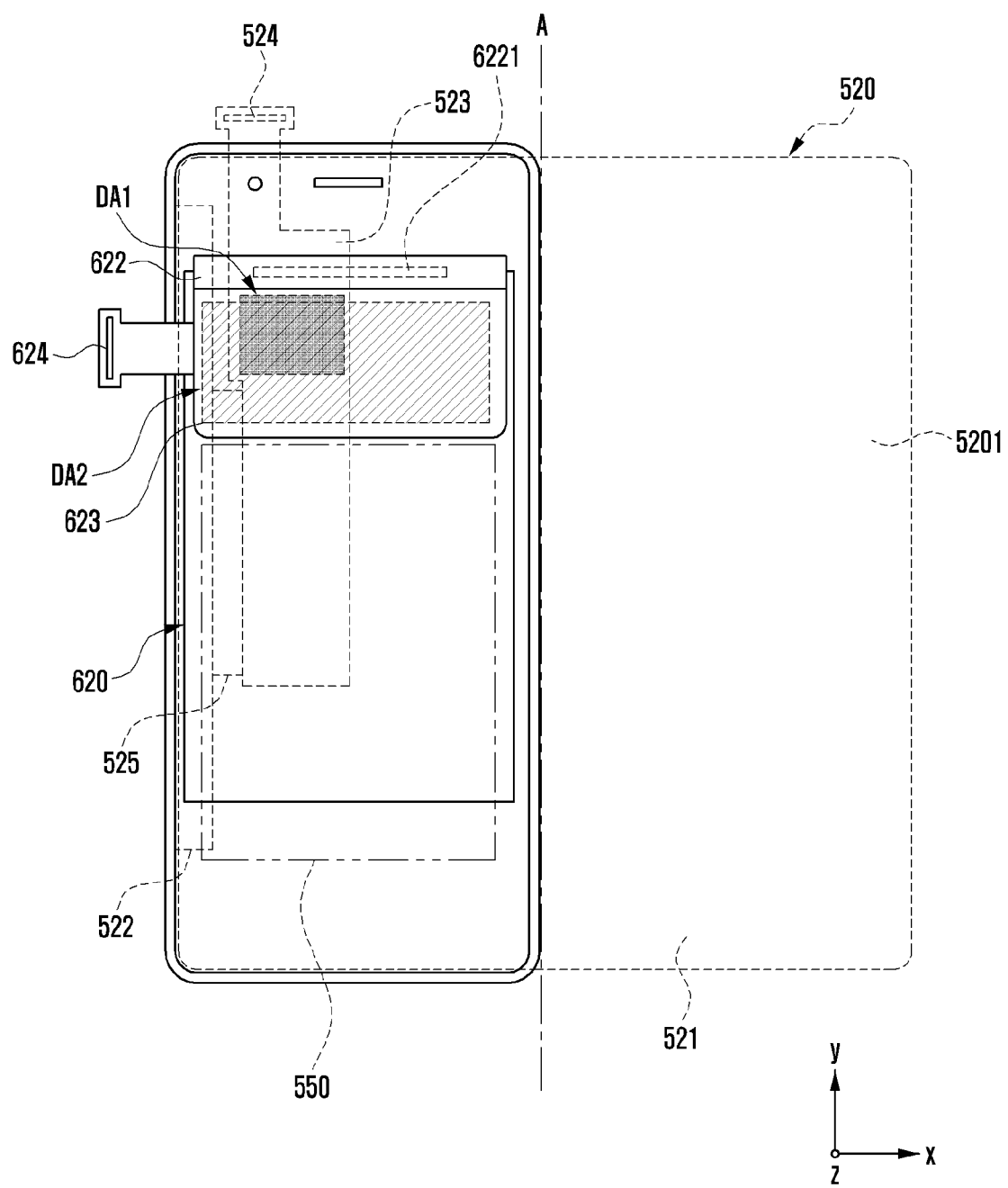
FIG. 7 is a diagram illustrating a state in which a first display and a second display are overlapped according to various embodiments of the disclosure.

FIG. 7 is a diagram illustrating a state in which the first display 520 and the second display 620 are overlapped according to various embodiments of the disclosure. At least one of the components of the first display 520 and/or the second display 620 of FIG. 7 may be similar to at least one of the components of the first display 520 of FIG. 5 and/or the second display 620 of FIG. 6 and hereinafter below redundant explanation will be omitted.

With reference to FIG. 7, in the case that the first display 520 (e.g., the display 130 of FIG. 1) is viewed in the z-axis direction (e.g., in the case that the front 5201 of the first display is viewed from above), the second display 620 (e.g., the sub-display 152 of FIG. 1) may be disposed to overlap with at least a portion of the first display 520. According to an embodiment, the second display 620 may be disposed to overlap with the area of the first display 520 facing the second housing (e.g., the second housing 120 of FIG. 1). In this case, the second battery 550 may be disposed between the first display 520 and the second display 620. According to an embodiment, in the case that the first display 520 is viewed in the z-axis direction, the second battery 550 may be disposed so as not to overlap with the first element arrangement area DA1 of the first display 520 and the second element arrangement area DA2 of the second display 620. According to an embodiment, the first element arrangement area DA1 and the second element arrangement area DA2 may be arranged to at least partially overlap in the case that the first display 520 is viewed in the z-axis direction.

According to various embodiments, the second display 620, even if the second element arrangement area DA2 does not overlap with the second battery 550 in the case that the second display 620 is viewed in the z-axis direction, may be disposed so that at least a portion of the remaining area of the second display 620 except for the second element arrangement DA2 may be supported by the second battery 550. Accordingly, disposing efficiently the first element arrangement area DA1 and/or the second element arrangement DA2 in the internal space of the second housing (e.g., the second housing 120 of FIG. 1) may help to slim the electronic device (e.g., the electronic device 100) in the case that the capacity of the battery 550 increases in accordance with an increase in the volume, or the volume of the second battery 550 does not change.

According to various embodiments, the control circuit (e.g., the control circuit 5221 of FIG. 5 and the control circuit 6221 of FIG. 6) may include the first element arrangement area DA1 and/or the second element arrangement area DA2. For example, the first control circuit (e.g., the control circuit 5221 of FIG. 5) may be disposed in the first element arrangement area DA1, and the second control circuit (e.g., the control circuit 6221 of FIG. 6) may be disposed in the second element arrangement area DA2.

An electronic device (e.g., 100 of FIG. 1) according to various embodiments of the present disclosure, as a foldable housing, may include a hinge (e.g., 164 of FIG. 3), a first housing 110 that is connected to the hinge (e.g., 164 of FIG. 3) and includes a first surface (e.g., 111 of FIG. 1) facing a first direction and a second surface (e.g., 112 of FIG. 1) facing a second direction opposite to the first direction, and a second housing (e.g., 120 of FIG. 1) that is connected to the hinge 164, includes a third surface (e.g., 121 of FIG. 1) facing a third direction and a fourth surface (e.g., 122 of FIG. 1) facing a fourth direction opposite to the third direction, and forms an angle in a preset range with the first housing 110 around a hinge 164, a foldable housing where a first surface 111 faces a third surface 121 in a folded state and a third direction is the same as the first direction in an unfolded state, a first display (e.g. 520 of FIG. 8) forming the first surface 111 and the third surface 121 and extending from the first surface 111 to the third surface 121, a second display (e.g., 620 of FIG. 8) exposed through at least a portion of the fourth surface 122, a circuit board (e.g., 830 of FIG. 8) disposed on at least a portion of the second housing 120, a first fingerprint sensor 1301 mounted to the front surface of the circuit board 830 and configured to detect a fingerprint through at least a portion of the first display 520 forming the third surface 121, and a second fingerprint sensor 1521 mounted to a rear surface of the circuit board 830 opposite to the front surface and configured to detect the fingerprint through at least a portion of the second display 620. The first fingerprint sensor 1301 may be disposed to at least partially overlap the second fingerprint sensor 1521. A support member disposed inside the foldable housing and supporting the first display 520 may be further included and the support member may include a transparent area formed between the first display 520 and the first fingerprint sensor 1301. The first display 520 may include a flat portion forming the first surface or the third surface 121, a bendable portion connected to the flat portion and disposed to be folded toward the rear surface of the first display 520, and a first FPCB electrically connected to the bendable portion, where the first FPCB may be electrically connected to the circuit board 830 through a first connecting member. The support member may include a through hole formed in at least a portion between the first FPCB and the circuit board 830, and the first connecting member may electrically connect the first FPCB and the circuit board 830 through the through hole. A second FPCB electrically connected to the second display 620 and disposed on a rear surface of the second display 620 may be further included and the second FPCB may be electrically connected to the circuit board 830 through a second connecting member. The first display 520 may include a window, a polarizing film, a display panel, a polymer member, and a conductive member, and, in the first display 520, the polymer member and the conductive member may be removed from a portion at least partially overlapping with the first fingerprint sensor 1301. A control circuit mounted to at least a portion of the circuit board 830 and driving the first fingerprint sensor 1301 and the second fingerprint sensor 1521 may be further included. The circuit board 830 may include a sensor PCB to which a control circuit is mounted and be electrically connected to the main PCB through a connector. The circuit board 830 may be a main PCB on which a control circuit is mounted. A sensor hole may be formed in at least a portion of the main PCB, and the first fingerprint sensor 1301 and the second fingerprint sensor 1521 may be mounted to the sensor hole. The circuit board 830 may further include a sensor light source mounted to at least one of the front surface and the rear surface.

The electronic device 100 according to various embodiments of the present disclosure may include a foldable housing in which at least a portion is folded, a flexible display 520 forming a front surface of the foldable housing in an unfolded state, a sub-display 620 that forms a part of a rear surface of the foldable housing in an unfolded state of the foldable housing and is disposed to overlap with a part of the flexible display 520, and a fingerprint sensor module disposed to overlap with the flexible display 520 and the sub-display 620 inside the foldable housing, where the fingerprint sensor module may include a circuit board 830, a first fingerprint sensor 1301 that is mounted to a front surface of the circuit board 830 and detects a fingerprint through at least a portion of the flexible display 520, and a second fingerprint sensor 1521 that is mounted to the rear surface of the circuit board 830 opposite to the front surface and detects the fingerprint through at least a portion of the sub-display 620. The first fingerprint sensor 1301 may be disposed to at least partially overlap with the second fingerprint sensor 1521. A support member disposed inside the foldable housing and supporting the flexible display 520 may be further included, and the support member may include a transparent area formed between the flexible display 520 and the first fingerprint sensor 1301. The flexible display 520 may include a flat portion, a bendable portion connected to the flat portion and disposed to be folded toward the rear surface of the flexible display 520, and a first FPCB electrically connected to the bendable portion, where the first FPCB may be electrically connected to the circuit board 830 through a first connecting member. The flexible display 520 may include a window, a polarizing film, a display panel, a polymer member, and a conductive member, and the polymer member and the conductive member may be removed from the flexible display 520 in the portion overlapping with the first fingerprint sensor 1301.

A fingerprint sensor capable of detecting a fingerprint in opposite directions (e.g., 1301 and 1521 of FIG. 8) according to various embodiments of the present disclosure may comprise a first fingerprint sensor mounted to the front surface of a circuit board to detect a fingerprint on the front surface thereof, and a second fingerprint sensor mounted to the rear surface, opposite to the front surface, of the circuit board to detect a fingerprint on the rear surface thereof, where the fingerprint sensors are disposed in the foldable electronic device of which at least a part is foldable, and detect the fingerprint on the basis of light received through at least a part of the foldable electronic device from both directions. The circuit board 830 may include a sensor PCB of the foldable electronic device 100 on which a control circuit is mounted and be electrically connected to the main PCB of the foldable electronic device 100 through a connector. The circuit board 830 may include a main PCB of the foldable electronic device 100 on which a control circuit is mounted.

Figure 8:
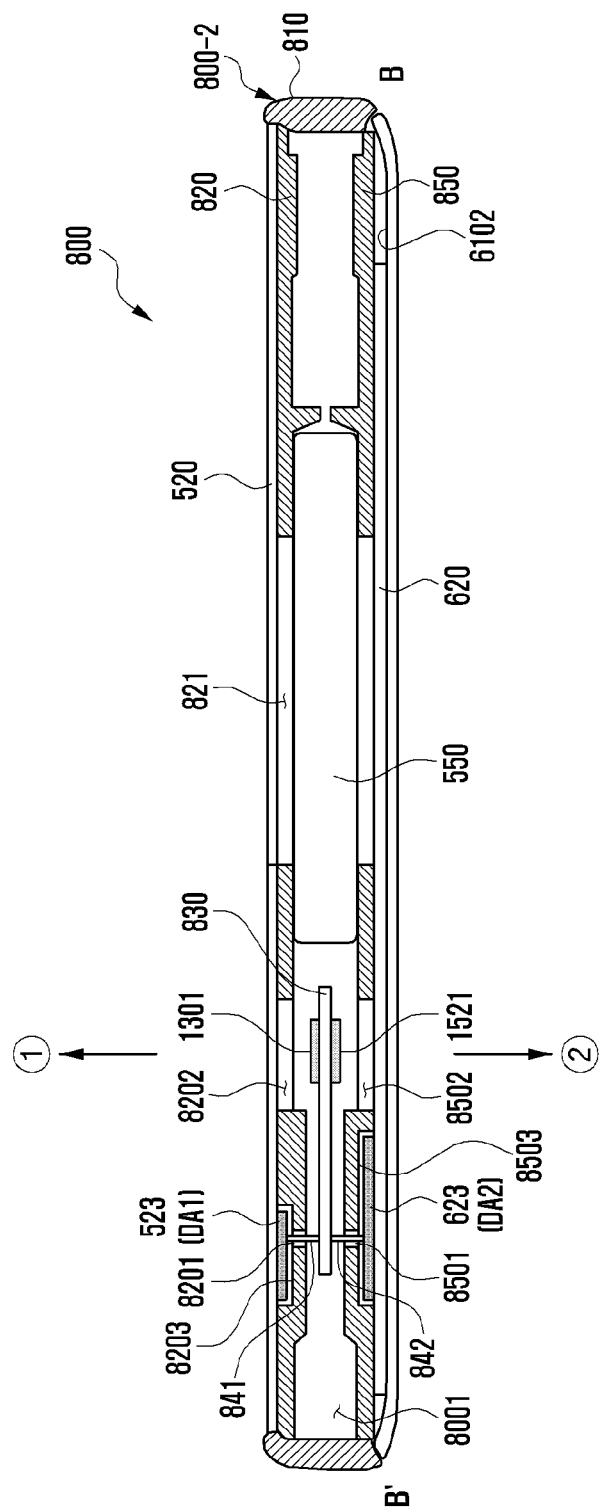
FIG. 8 is a cross-sectional view of an electronic device viewed along the line B-B' of FIG. 1 according to various embodiments of the disclosure.

FIG. 8 is a cross-sectional view of the electronic device 800 as viewed along line B-B' of FIG. 1 according to various embodiments of the disclosure.

The electronic device 800 of FIG. 8 may further include the embodiments that are at least partially similar to or different from the electronic device 100 of FIG. 1.

With reference to FIG. 8, the electronic device 800 (e.g., the electronic device 100 of FIG. 1) may include a second support member 820 (e.g., the second support member 162 of FIG. 3) that is disposed in the inner space 8001 and extends from the second side member 810 (e.g., the second side member 123 of FIG. 1) of the second housing 800-2 (e.g., the second housing 120 of FIG. 1) or is structurally coupled to the second side member 810. According to an embodiment, the electronic device 800 may include a first display 520 (e.g., the display 130 of FIG. 1) disposed to receive the support of the second support member 820. According to an embodiment, the first display 520 may be disposed to be folded toward the rear surface of the first display 520 and may be connected to the first FPCB 523 including the first element arrangement area DA1. According to an embodiment, the second support member 820 may include a recess 8203 formed to accommodate the first element arrangement area DA1 of the first FPCB 523. According to an embodiment, the second support member 820 may include a swelling hole 821 (e.g., the second swelling hole 1612 of FIG. 3) formed to accommodate a swelling phenomenon of the second battery 550 disposed in the inner space 8001 of the electronic device 800.

According to various embodiments, the electronic device 800 may include a second back cover 610 disposed to face in a direction opposite to the first display 520 (e.g., direction ②). According to an embodiment, the electronic device 800 may include the second display 152 (e.g., the sub-display 152 of FIG. 1) disposed on the rear surface 6102 of the second back cover 610 in the internal space 8001 and being disposed to be visible from the outside through at least a part of the second display 620. According to an embodiment, the second display 620 may be connected to the second FPCB 623 that is disposed to be folded toward the rear surface of the second display 620 and includes the second element arrangement area DA2.

According to various embodiments, the electronic device 800 may include the second PCB 830 (e.g., the second PCB 172 of FIG. 3) disposed between the second support member 820 and the second back cover 610. According to an embodiment, the second PCB 830 may be disposed to receive the support of the second support member 820, and may be electrically connected to the first FPCB 523 and/or the second FPCB 623.

In an embodiment, the second PCB 830 may mount fingerprint sensors 1301 and 1521 (e.g., 1301 and 1521 of FIG. 1). The front surface of the second PCB 830 may be disposed in a direction (e.g., direction ①) facing the first display 520, and the rear surface of the second PCB 830 opposite to the front surface may be disposed in a direction (e.g., direction ②) facing the second display 620.

In an embodiment, the first fingerprint sensor 1301 may be mounted to the front surface of the second PCB 830. The first fingerprint sensor 1301 may detect a fingerprint through at least a portion of the first display 520 that forms the third surface (e.g., the third surface 121 of FIG. 1) of the electronic device 800. For example, the first fingerprint sensor 1301 may detect a fingerprint from the front direction (e.g., direction ①) of the electronic device 800 in which the first display 520 is viewed.

In an embodiment, the second fingerprint sensor 1521 may be mounted to the rear surface of the second PCB 830. The second fingerprint sensor 1521 may detect a fingerprint through at least a portion of the second display 620. For example, the second fingerprint sensor 1521 may detect a fingerprint from the rear direction (e.g., direction ②) of the electronic device 800 in which the second display 620 is viewed.

In an embodiment, the first fingerprint sensor 1301 and the second fingerprint sensor 1521 may be disposed to overlap each other in the case of being viewed from the front direction (e.g., direction ①) of the electronic device 800 in which the first display 520 is shown. Alternatively, the first fingerprint sensor 1301 and the second fingerprint sensor 1521 may be disposed to overlap each other in the case of being viewed from the rear direction (e.g., direction ②) of the electronic device 800 in which the second display 620 is shown.

In an embodiment, the second support member 820 may have a first transmission area 8202 formed between the first display 520 and the first fingerprint sensor 1301. The first transmission area 8202 of the second support member 820 may form a hole (e.g., an air gap) of the second support member 820. The first transmission area 8202 of the second support member 820 may be formed of a material having high transmittance (e.g., optical clear resin (OCR)).

In an embodiment, the second PCB 830 may be electrically connected to the first FPCB 523 of the first display 520 through the first connecting member 841. In an embodiment, the second support member 820 may have a first through hole 8201 formed in a portion between the second PCB 83 and the first FPCB 523, and the first connecting member 841 may enable the second PCB 830 and the first FPCB 523 to be electrically connected through the first through hole 8201. In an embodiment, the first connecting member 841 may include a connector (e.g., the connector 524 of FIG. 5) of the first FPCB 523.

In an embodiment, the electronic device 800 may further include a third support member 850 disposed in the interior space 8001 and extending from the second side member 810 or structurally coupled to the second side member 810. For example, the third support member 850 may serve to support the second display 620. In an embodiment, the second display 620 may include a second FPCB 623 disposed to be folded toward the rear surface of the second display 620 and including the second element arrangement area DA2. The third support member 850 may include a recess 8503 accommodating the second element arrangement area DA2 of the second FPCB 623.

In an embodiment, the third support member 850 may have a second transmission area 8502 formed between the second display 620 and the second fingerprint sensor 1521. The second transmission area 8502 of the third support member 850 may form a hole (e.g., an air gap) of the third support member 850. The second transmission area 8502 of the third support member 850 may be formed of a material having high transmittance (e.g., OCR).

In an embodiment, the second PCB 830 may be electrically connected to the second FPCB 623 of the second display 620 through the second connecting member 842. In an embodiment, the third supporting member 840 may have a second through hole 8501 formed in a portion between the second PCB 830 and the second FPCB 623, and the second connecting member 842 may enable the second PCB 830 and the second FPCB 623 to be electrically connected through the through hole 8501. In an embodiment, the second connecting member 842 may include a connector (e.g., the connector 624 of FIG. 6) of the second FPCB 623.

In an embodiment, the second support member 820 and the third support member 850 may be integrally formed. For example, at least a portion of the third support member 850 may be connected to the second support member 820. In another embodiment, the second support member 820 and the third support member 850 may not be integrally formed.

Figure 9:
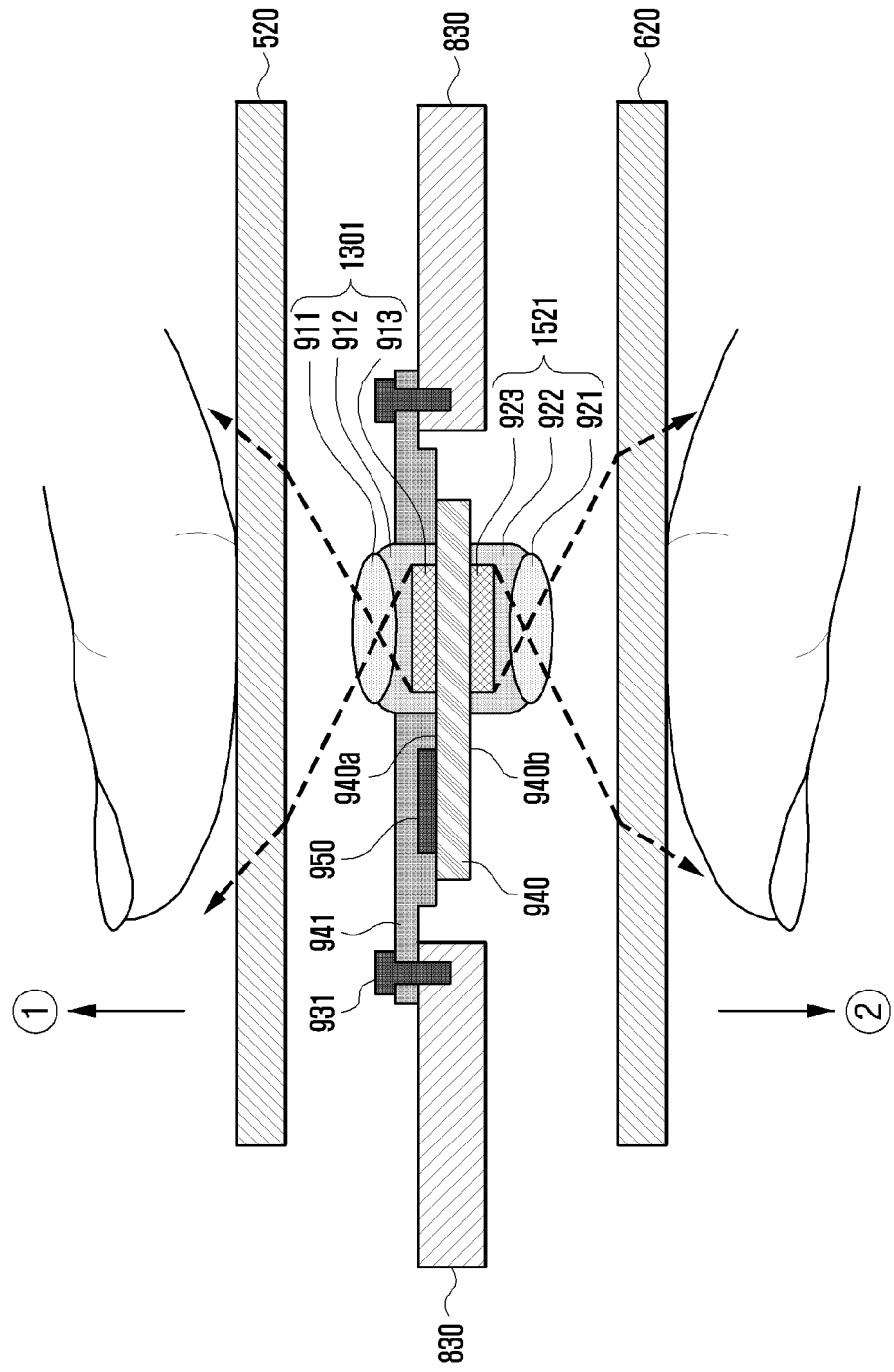
FIG. 9 is a cross-sectional view schematically illustrating a structure of a fingerprint sensor according to various embodiments of the disclosure.

FIG. 9 is a cross-sectional view illustrating a structure of a fingerprint sensor according to various embodiments of the disclosure.

The fingerprint sensors 1301 and 1521 shown in FIG. 9 may be the same as or similar to the fingerprint sensors 1301 and 1521 shown in FIG. 8 or the fingerprint sensors 1301 and 1521 shown in FIG. 1, or further include another embodiment.

With reference to FIG. 9, a method for detecting a fingerprint by the fingerprint sensors 1301 and 1521 according to an embodiment may be as follows. A display (e.g., the display 130 of FIG. 1, the sub-display 152 of FIG. 1), for example, the first display 520, may generate light of a specified wavelength, and the light may be reflected after reaching the fingerprint. The light reflected from the fingerprint may pass through the first display 520 and be transmitted to a fingerprint sensor, for example, the first fingerprint sensor 1301. The first fingerprint sensor 1301 may acquire fingerprint information on the basis of the incident light.

In an embodiment, the fingerprint sensors 1301 and 1521 may be fixed to the main PCB, sub-PCB, or FPCB of the display and may be arranged to maintain a constant distance from the display (e.g., the first display 520 and the second display 620). In the illustrated example, the fingerprint sensors 1301 and 1521 may be mounted to the sensor PCB 940.

In an embodiment, fingerprint sensors 1301 and 1521 may be configured to include lenses 911 and 921, housings 912 and 922, sensors 913 and 923, a controller (or control circuit) 950, or a sensor PCB 940.

According to an embodiment, lenses 911 and 921 may be positioned above the sensors 913 and 923. According to an embodiment, the lenses 911 and 921 may be fixed while maintaining a constant distance from the sensors 913 and 923. According to another embodiment, the distance between the lenses 911 and 921 and the sensors 913 and 923 may be changed by a mechanism connected to the housings 912 and 922.

According to an embodiment, the lenses 911 and 921 may collect light reflected from the fingerprint and transmit the collected light to the sensors 913 and 923. According to an embodiment, the lenses 911 and 921 may adjust the focal length between the sensors 913 and 923 and the fingerprint. For example, the sensors 913 and 923 may be disposed below the lenses 911 and 921, be mounted to the sensor PCB 940 (e.g., the front surface 940a of the sensor PCB 940 or the rear surface 940b of the sensor PCB 940), detect light, and transmit fingerprint information (or fingerprint data) on the basis of the sensed light to the controller 950. The controller 950 may post-process the fingerprint information to generate a fingerprint image, and transmit the generated fingerprint image to a processor (e.g., an application processor (AP)).

In an embodiment, the first fingerprint sensor 1301 may include a first lens 911 or a first sensor 913. The first fingerprint sensor 1301 may be mounted to the front surface 940a of the sensor PCB 940 to detect a fingerprint from the front direction (①) of the electronic device (e.g., 800 in FIG. 8) in which the first display 520 is shown.

In an embodiment, the second fingerprint sensor 1521 may include a second lens 921 or a second sensor 923. The second fingerprint sensor 1521 may be mounted to the rear surface 940b of the sensor PCB 940 to detect a fingerprint from the rear direction (②) of the electronic device 800 in which the second display 620 is shown.

In an embodiment, the first lens 911 of the first fingerprint sensor 1301 and the second lens 921 of the second fingerprint sensor 1521 may be designed to have a specified refractive index. The refractive index of the first lens 911 may be determined on the basis of a distance between the first lens 911 and the first display 520. The refractive index of the second lens 921 may be determined on the basis of a distance between the second lens 921 and the second display 620. For example, in the case that the first distance between the first lens 911 and the first display 520 is equal to the second distance between the second lens 921 and the second display 620, the refractive index of the first lens 911 and the refractive index of the second lens 921 may be substantially the same. For example, in the case that the first distance between the first lens 911 and the first display 520 is different from the second distance between the second lens 921 and the second display 620, the refractive index of the first lens 911 and the refractive index of the second lens 921 may be different.

In an embodiment, the sensor PCB 940 may be a PCB made of a non-bendable material (e.g., FR4) or a FPCB that may be bent.

In an embodiment, the first sensor 913 of the first fingerprint sensor 1301 and the second sensor 923 of the second fingerprint sensor 1521 may be separate components or may be integrated into one sensor. For example, the sensors may be implemented with a complementary metal-oxide semiconductor (CMOS) or a thin film transistor (TFT), and they may receive light from both front and rear surfaces.

In an embodiment, the controller 950 may be mounted to the front surface 940a of the sensor PCB 940, and it may drive (or control) the first fingerprint sensor 1301 and/or the second fingerprint sensor 1521.

In an embodiment, the controller 950 may be integrated with the first sensor 913 of the first fingerprint sensor 1301 and/or the second sensor 923 of the second fingerprint sensor 1521.

In an embodiment, the sensor PCB 940 may include a fixing substrate 941 coupled to (or attached to) the front surface 940a of the sensor PCB 940 to secure the sensor PCB 940. For example, a portion adjacent to at least one of one side or the other side of the fixed substrate 941 may be coupled to the main PCB 830 (e.g., the second PCB 830 of FIG. 8) through the connecting member 931. For example, the connecting member 931 may be a screw penetrating a portion of the fixed substrate 941 and a portion of the main PCB 830. According to another embodiment, the connecting member 931 may be replaced with various known components for connecting and/or fixing different PCBs in addition to screws.

Figure 10:
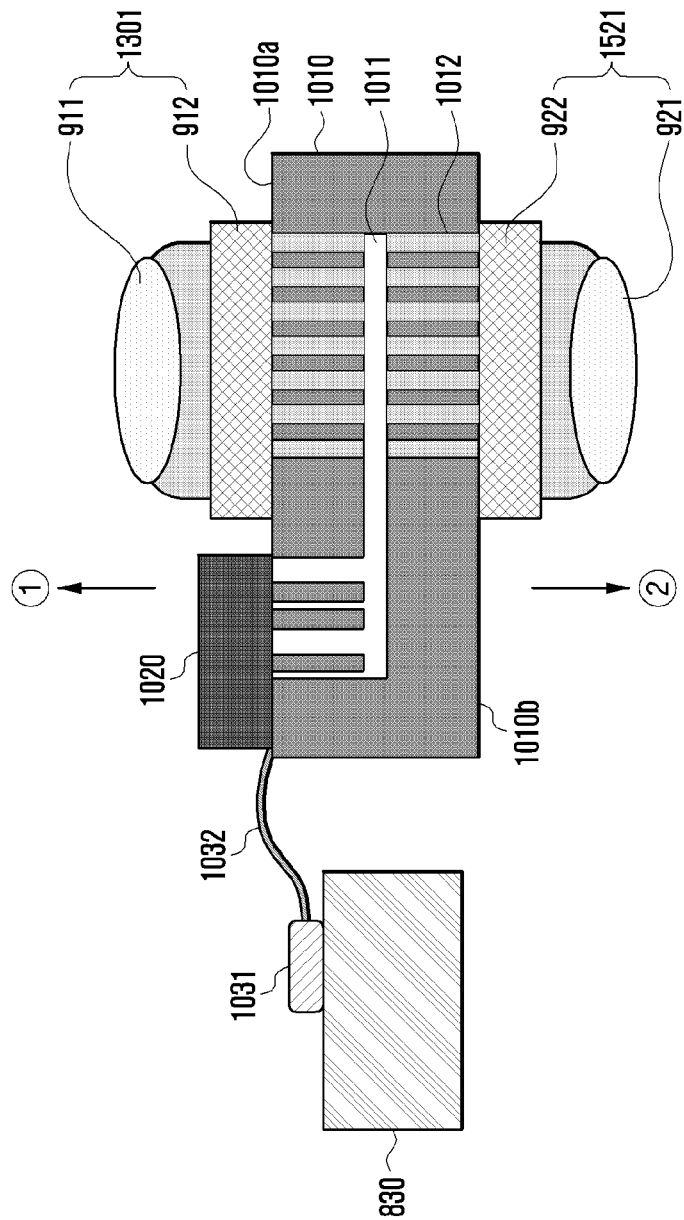
FIG. 10 is a cross-sectional view illustrating a connection structure between a fingerprint sensor and a main printed circuit board (PCB) according to various embodiments of the disclosure.

FIG. 10 is a cross-sectional view illustrating a connection structure between a fingerprint sensor and a main PCB according to various embodiments of the disclosure.

The fingerprint sensors 1301 and 1521 shown in FIG. 10 may be the same as or similar to the fingerprint sensors 1301 and 1521 shown in FIG. 8 or the fingerprint sensors 1301 and 1521 shown in FIG. 1, or further include another embodiment.

The fingerprint sensors 1301 and 1521 illustrated in FIG. 10 may be the same as or similar to the fingerprint sensors 1301 and 1521 illustrated in FIG. 9. In FIG. 10, the same reference numerals denote the same components as those of FIG. 9, and the description of the components having the same reference numerals is replaced with that described in FIG. 9.

With reference to FIG. 10, the first fingerprint sensor 1301 may be mounted to the front surface 1010a (e.g., the surface facing the direction ①) of the sensor PCB 1010 (e.g., the sensor PCB 940 of FIG. 9), and the second fingerprint sensor 1521 may be mounted to the rear surface 1010b (e.g., the surface facing the direction of ②) of the sensor PCB 1010.

In an embodiment, at least one signal line (e.g., a power line or a sensor signal line) 1011 may be formed inside the sensor PCB 1010. For example, at least one signal line 1011 may be electrically connected to a first fingerprint sensor 1301, a second fingerprint sensor 1521, and/or a controller 1020 (e.g., control circuit) through at least one via 1012.

In an embodiment, at least one signal line (e.g., a power line or a sensor signal line) 1011 may be shared by the first fingerprint sensor 1301 and the second fingerprint sensor 1521. For example, the controller 1020 (e.g., a control circuit) may distinguish and process the acquired signal (e.g., the signal of the first fingerprint sensor 1301 and the signal of the second fingerprint sensor 1521) using various criteria (e.g., time, indicator, etc.) to process the signals acquired from the first fingerprint sensor 1301 and the second fingerprint sensor 1521. For example, the controller 1020 (e.g., a control circuit) may perform fingerprint recognition by alternately processing the acquired signal at a specified time interval or providing a distinguishable indicator (e.g., additional data) to the acquired signal.

In an embodiment, the signal line connected to the first fingerprint sensor 1301 and the second fingerprint sensor 1521 may be distinguished from at least one signal line (e.g., a power line or a sensor signal line) 1011. For example, at least one signal line may include a first signal line and a second signal line where the first signal line is electrically connected to the first fingerprint sensor 1301 and the second signal line is electrically connected to the second fingerprint sensor 1521. The controller 1020 (e.g., a control circuit), for example, may obtain a signal of the first fingerprint sensor 1301 using a first signal line and a signal of the second fingerprint sensor 1521 using a second signal line.

In an embodiment, the sensor PCB 1010 may be coupled to the main PCB 830 (e.g., the second PCB 830 of FIG. 8) through a connecting member (e.g., the screw 931 of FIG. 9). In an embodiment, the sensor PCB 1010 may be electrically connected to the main PCB 830 through the connector terminal 1031 of the main PCB 830 and/or the connector 1032 of the sensor PCB 1010.

In an embodiment, the connector 1032 may utilize various types of attachment methods. For example, the connector 1302 may use a fastening type connector, an adhesive type connector, or a contact type connector, and electrically connect the sensor PCB 1010 and the main PCB 830 with an attachment method corresponding to each connector.

Figure 11:
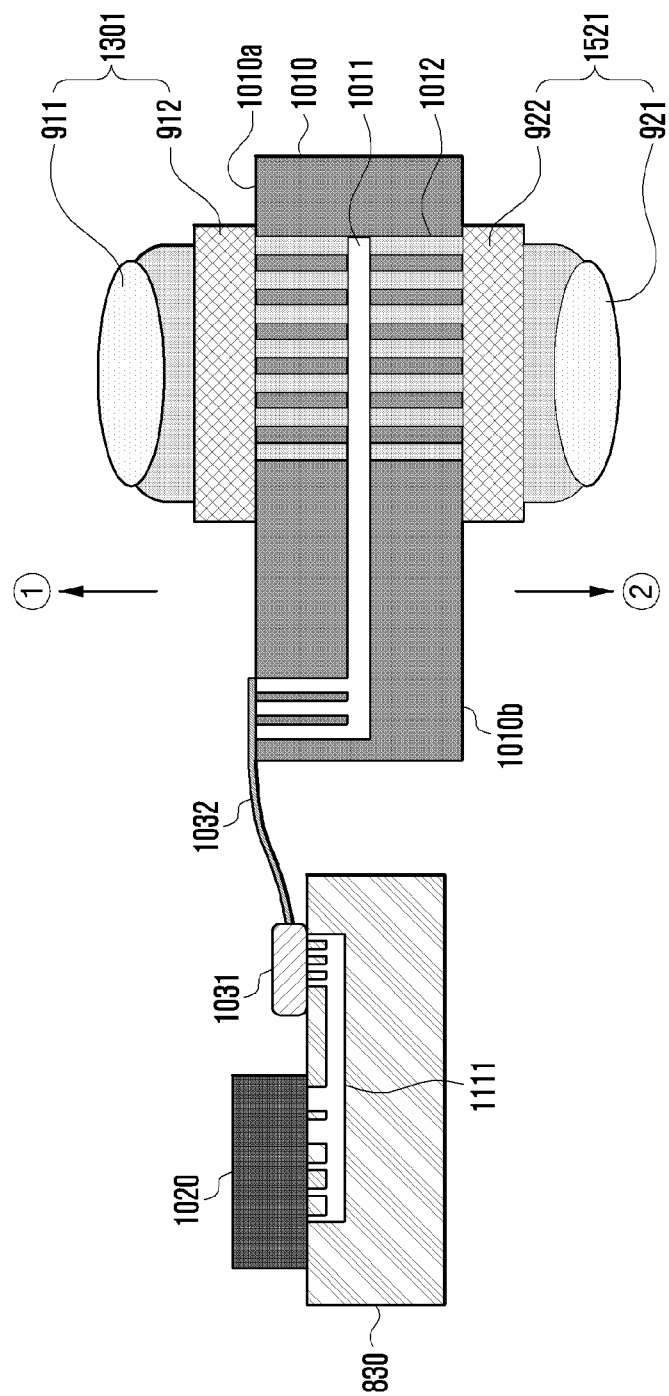
FIG. 11 is a cross-sectional view illustrating a connection structure between a fingerprint sensor and a main PCB according to various embodiments of the disclosure.

FIG. 11 is a cross-sectional view illustrating a connection structure between a fingerprint sensor and a main PCB according to various embodiments of the disclosure.

The fingerprint sensors 1301 and 1521 shown in FIG. 11 may further include the embodiments that are the same as, similar to, or different from the fingerprint sensors 1301 and 1521 shown in FIGS. 9 and 10 or the fingerprint sensors 1301 and 1521 shown in FIG. 1. In FIG. 11, the same reference numerals are denoted for the same components as those of FIGS. 9 and 10, and the descriptions of the components having the same reference numerals are replaced with those described in FIGS. 9 and 10.

With reference to FIG. 11, a controller 1020 (e.g., a control circuit) may be mounted to an external PCB, for example, a main PCB 830 (e.g., the second PCB 830 of FIG. 8).

In an embodiment, at least one signal line (e.g., a power line or a sensor signal line) 1111 may be formed in the main PCB 830, and the at least one signal line 1111 may be electrically connected to the controller 1020 and/or the connector terminal 1031 through at least one via.

Figure 12:
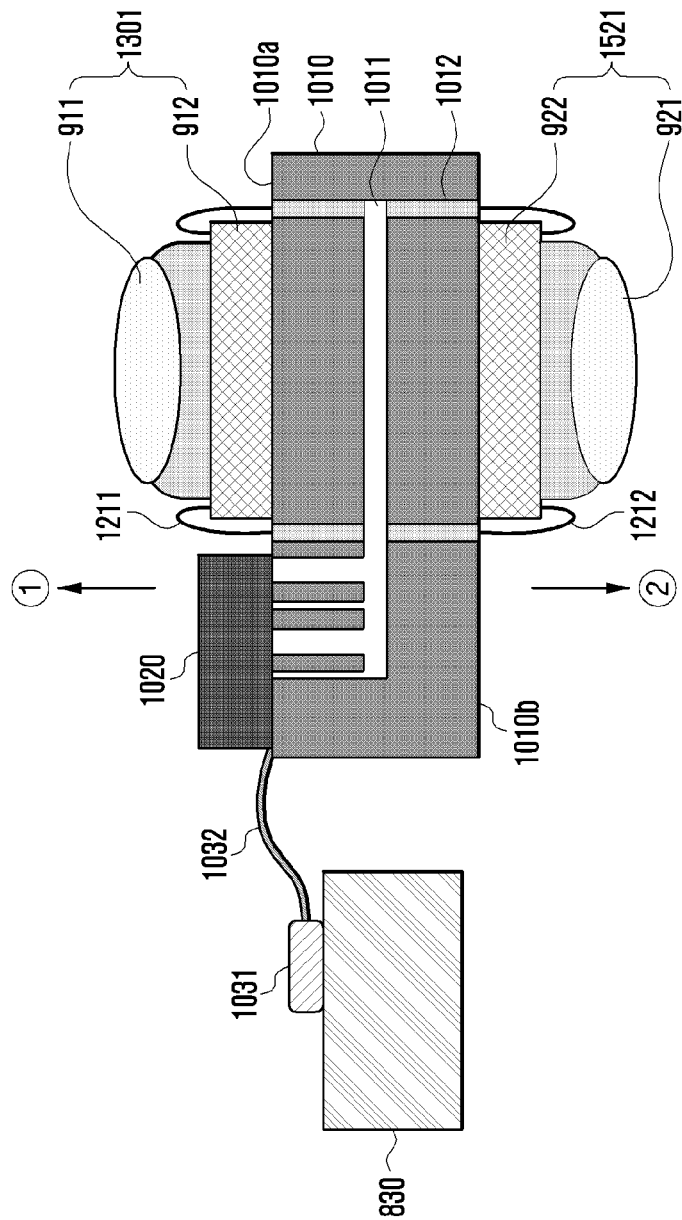
FIG. 12 is a cross-sectional view illustrating a structure of a fingerprint sensor bonded using a wire according to various embodiments of the disclosure.

FIG. 12 is a cross-sectional view illustrating a structure of a fingerprint sensor bonded using a wire according to various embodiments of the disclosure.

The fingerprint sensors 1301 and 1521 shown in FIG. 12 may further include the embodiments that are the same as, similar to, or different from the fingerprint sensors 1301 and 1521 shown in FIGS. 9 to 11 or the fingerprint sensors 1301 and 1521 shown in FIG. 1. In FIG. 12, the same reference numerals are denoted for the same components as those of FIGS. 9 to 11, and the descriptions of the components having the same reference numerals are replaced with those described in FIGS. 9 to 11.

With reference to FIG. 12, the fingerprint sensors 1301 and 1521 may be electrically connected to the sensor PCB 1010 by soldering or wire bonding 1211 of the pad part. In various embodiments, a method of electrically connecting the fingerprint sensors 1301 and 1521 and the sensor PCB 1010 may be variously changed.

Figure 13:
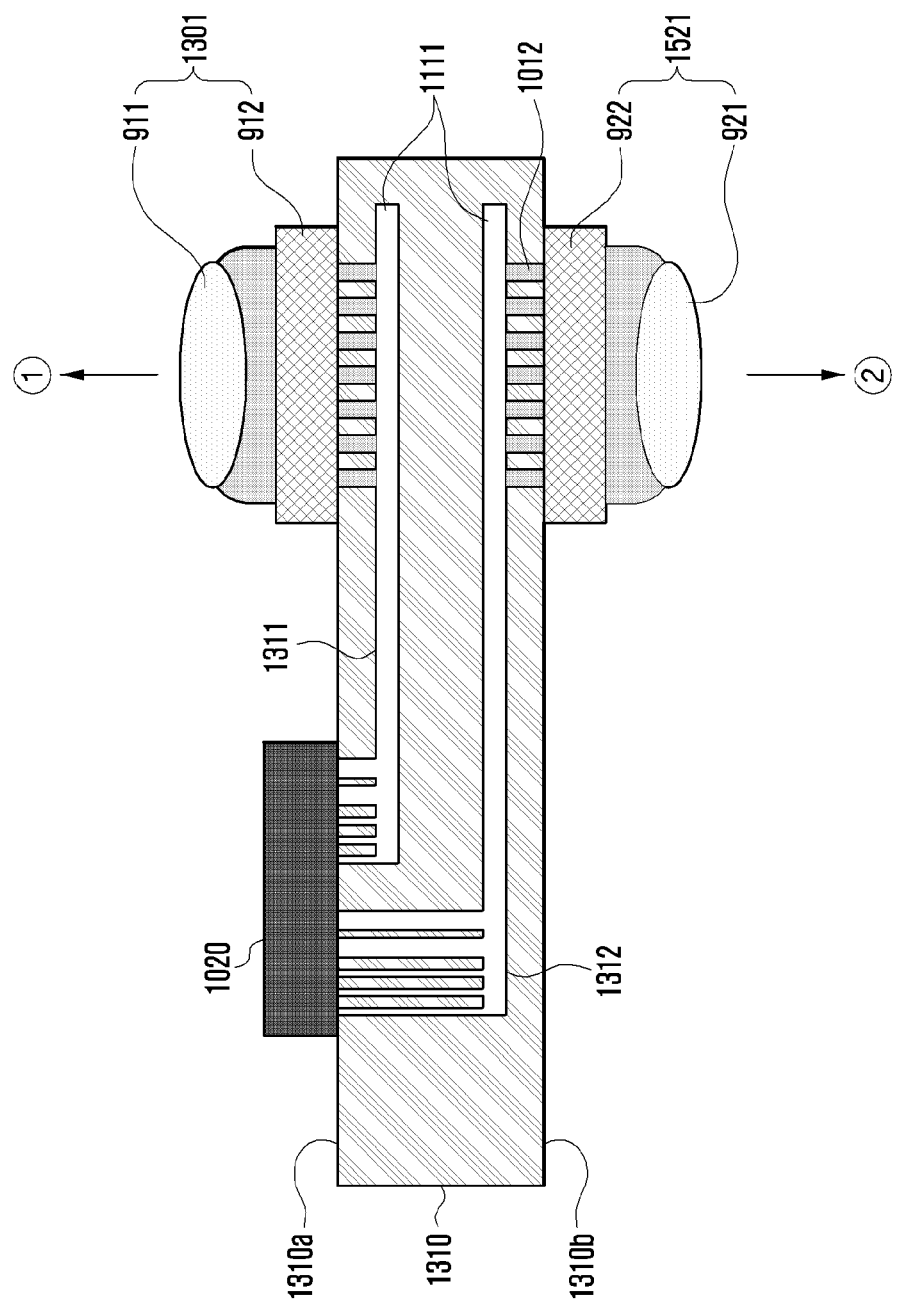
FIG. 13 is a cross-sectional view illustrating a structure of a fingerprint sensor mounted to a main PCB according to various embodiments of the disclosure.

FIG. 13 is a cross-sectional view illustrating a structure of a fingerprint sensor mounted to a main PCB according to various embodiments of the disclosure.

The fingerprint sensors 1301 and 1521 shown in FIG. 13 may include the embodiments that are the same as, similar to, or different from the fingerprint sensors 1301 and 1521 shown in FIGS. 9 to 12 or the fingerprint sensors 1301 and 1521 shown in FIG. 1. In FIG. 13, the same reference numerals are denoted for the same components as those of FIGS. 9 to 12, and the descriptions of the components having the same reference numerals are replaced with those described with reference to FIGS. 9 to 12.

With reference to FIG. 13, the fingerprint sensors 1301 and 1521 may be mounted to an external PCB 1310 (e.g., the second PCB 830 of FIG. 8). The external PCB 1310 may be, for example, a main PCB, a sub-PCB, or an FPCB 523 (e.g., the first FPCB 523 and the second FPCB 623 of FIG. 8) connected to a display (e.g., display 130 of FIG. 1, sub-display 152 of FIG. 1).

In an embodiment, the first fingerprint sensor 1301 may be mounted to the front surface 1310a (e.g., direction ①) of the external PCB 1310, and the second fingerprint sensor 1521 may be mounted to the rear surface 1310b (e.g., direction ②) of the external PCB 1310.

In an embodiment, at least one signal line (e.g., a power line or a sensor signal line) 1111 may be formed inside the external PCB 1310, and the at least one signal line 1111 may be electrically connected to the first fingerprint sensor 1301, the second fingerprint sensor 1521, or the controller 1020. At least one signal line 1111 may include at least one first signal line 1311 connecting the first fingerprint sensor 1301 and the controller 1020, and at least one second signal line 1312 connecting the second fingerprint sensor 1521 and the controller 1020.

In an embodiment, the fastening between the first fingerprint sensor 1301 and the second fingerprint sensor 1521 and the external PCB 1310 may use a pad soldering method or a wire bonding method. In another embodiment, in attaching the first fingerprint sensor 1301 and the second fingerprint sensor 1521 to the external PCB 1310, the first fingerprint sensor 1301 and the second fingerprint sensor 1521 may be attached high from the surface (e.g., the front side 1310a or the rear side 131b) of the external PCB 1310 using an auxiliary structure. In another embodiment, the external PCB 1310 may include a stepped portion having a lower height than a surface (e.g., a front surface 1310a or a rear surface 1310b) of the external PCB 1310, and the first fingerprint sensor 1301 and the second fingerprint sensor 1521 may be mounted to the stepped portion. For example, the height of the surface where the first fingerprint sensor 1301 and the second fingerprint sensor 1521 are attached to the external PCB 1310 may be lower than the height of the surface of the external PCB 1310 (e.g., the front side 1310a or the rear side 1310b).

Figure 14:
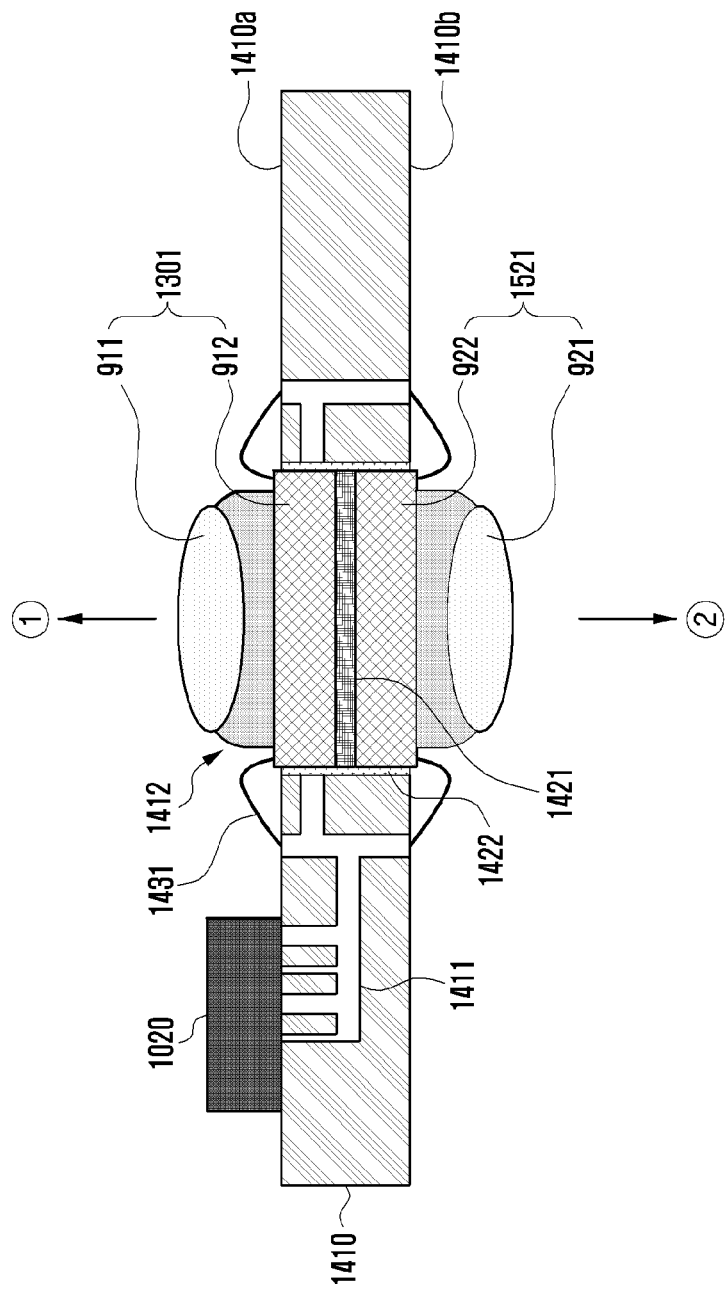
FIG. 14 is a cross-sectional view illustrating a structure of a fingerprint sensor mounted to a sensor hole of a main PCB according to various embodiments of the disclosure.

FIG. 14 is a cross-sectional view illustrating a structure of a fingerprint sensor mounted to a sensor hole of a main PCB according to various embodiments of the disclosure.

The fingerprint sensors 1301 and 1521 shown in FIG. 14 may further include the embodiments that are the same as, similar to, or different from the fingerprint sensors 1301 and 1521 shown in FIGS. 9 to 13 or the fingerprint sensors 1301 and 1521 shown in FIG. 1. In FIG. 14, the same reference numerals are denoted for the same components as those of FIGS. 9 to 13, and the descriptions of the components having the same reference numerals are replaced with those described with reference to FIGS. 9 to 13.

With reference to FIG. 14, the fingerprint sensors 1301 and 1521 may be mounted to an external PCB 1410 (e.g., the second PCB 830 of FIG. 8). The external PCB 1410 may be, for example, a main PCB, sub-PCB, or FPCB 523 (e.g., the first FPCB 523 and the second FPCB 623 of FIG. 8) connected to a display (e.g., display 130 of FIG. 1, sub-display 152 of FIG. 1).

In an embodiment, the first fingerprint sensor 1301 may be mounted to the front surface 1410a of the external PCB 1410, and the second fingerprint sensor 1521 may be mounted to the rear surface 1410b of the external PCB 1410.

In an embodiment, at least one signal line (e.g., a power line or a sensor signal line) 1411 may be formed inside the external PCB 1410. In an embodiment, at least one signal line 1411 may be electrically connected to the first fingerprint sensor 1301 and the second fingerprint sensor 1521 through wire bonding 1431 (e.g., wire bonding 1211 of FIG. 12).

In an embodiment, a sensor hole 1412 may be formed in at least a portion of the external PCB 1410, and at least a portion of the fingerprint sensors 1301 and 1521 may be mounted to the sensor hole 1412. For example, the first fingerprint sensor 1301 and the second fingerprint sensor 1521 may be mounted to overlap each other in the sensor hole 1412 in the case of being viewed from the front 1410a (e.g., direction ①) or the rear surface 1410b (e.g., direction ②). In an embodiment, the first fingerprint sensor 1301 and the second fingerprint sensor 1521 may be attached to each other by an adhesive member 1421 in the sensor hole 1412. In an embodiment, an additional adhesive member 1422 may be formed on the inner side surface of the sensor hole 1412, and the first fingerprint sensor 1301 and the second fingerprint sensor 1521 may be attached to the inner side of the sensor hole 1412 by the additional adhesive member 1422. According to some embodiments, the first fingerprint sensor 1301 and the second fingerprint sensor 1521 are not separate, but they may be a single sensor capable of receiving light from opposite directions (e.g., direction ① and direction ②).

Figure 15:
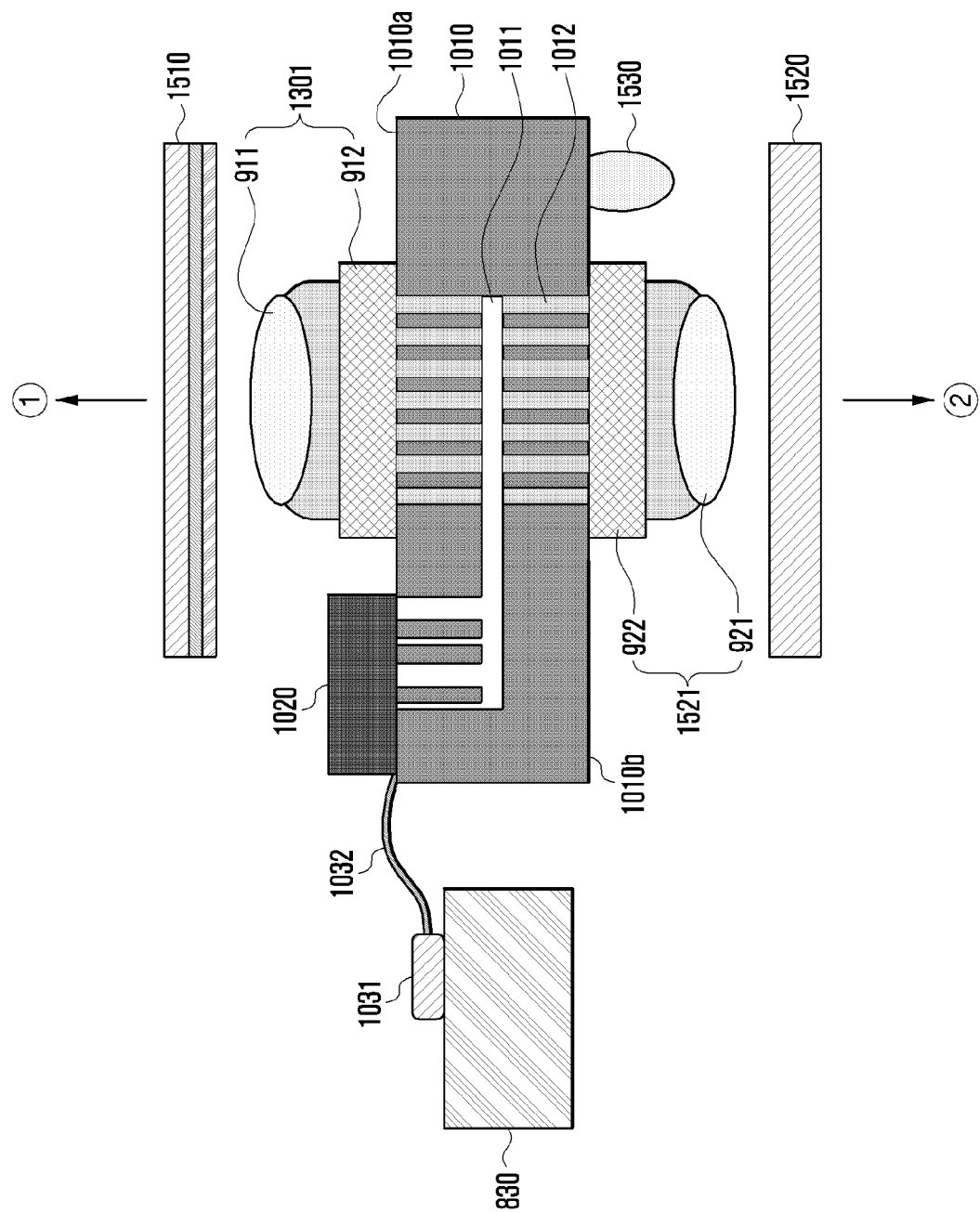
FIG. 15 is a cross-sectional view illustrating a structure of a fingerprint sensor having a separate light source according to various embodiments of the disclosure.

FIG. 15 is a cross-sectional view illustrating a structure of a fingerprint sensor having a separate light source according to various embodiments of the disclosure.

The fingerprint sensors 1301 and 1521 shown in FIG. 15 may further include the embodiments that are the same as, similar to, or different from the fingerprint sensors 1301 and 1521 shown in FIGS. 9 to 14 or the fingerprint sensors 1301 and 1521 shown in FIG. 1. In FIG. 15, the same reference numerals are denoted for the same components as those of FIGS. 9 to 14, and the descriptions of the components having the same reference numerals are replaced with those described with reference to FIGS. 9 to 14.

With reference to FIG. 15, in a direction in which at least one of the fingerprint sensors 1301 and 1521 is mounted, at least one window having a feature through which light is transmitted, such as glass, may be positioned. For example, the first fingerprint sensor 1301 may be disposed to face the display 1510 (e.g., the display 130 of FIG. 1, the sub-display 152 of FIG. 1), and the second fingerprint sensor 1521 may be disposed to face the window 1520. In an embodiment, the first fingerprint sensor 1301 facing the display 1510 may include a first optical filter that may pass only a visible light wavelength band. In an embodiment, the second fingerprint sensor 1521 facing the window 1520 may include a second optical filter capable of passing only a designated band, for example, an infrared (IR) wavelength band.

In an embodiment, the second fingerprint sensor 1521 may require an external light source for fingerprint sensing. For example, at least one sensor light source 1530 emitting light of a specified band may be mounted to one surface of the sensor PCB 1010, for example, the rear surface 1010b of the sensor PCB 1010. In an embodiment, at least one sensor light source 1530 may emit light of a specified band for the second fingerprint sensor 1521 to sense a fingerprint.

In an embodiment, the controller 1020 (e.g., a control circuit) may control the operation of the at least one sensor light source 1530. For example, the controller 1020 (e.g., a control circuit) may control the operation of the at least one sensor light source 1530 by interworking with the fingerprint recognition operation of the second fingerprint sensor 1521. The controller 1020 (e.g., a control circuit) may emit light of a specified band from at least one sensor light source 1530 in the case that the second fingerprint sensor 1521 performs a fingerprint recognition operation, and it may not emit light of a specified band from at least one sensor light source 1530 in the case that the second fingerprint sensor 1521 does not perform a fingerprint recognition operation.

In an embodiment, the controller 1020 (e.g., a control circuit) may control the operation of the at least one sensor light source 1530 on the basis of the operation state of the second fingerprint sensor 1521. For example, the controller 1020 (e.g., a control circuit) may recognize a fingerprint using a signal obtained from the second fingerprint sensor 1521, and control an operation of at least one sensor light source 1530 on the basis of the degree of the recognized fingerprint (e.g., 0% to 100%). The controller 1020 (e.g., a control circuit) may emit light by increasing the intensity (e.g., brightness) of the at least one sensor light source 1530 in the case that, for example, the degree of the recognized fingerprint is less than 10%.

In an embodiment, the electronic device 100 may include a plurality of sensor light sources, and among the plurality of sensor light sources, a first sensor light source may emit light corresponding to a first band, and a second sensor light source may emit light corresponding to a second band. In an embodiment, the controller 1020 (e.g., control circuit) may control the operation of the plurality of sensor light sources on the basis of the recognized fingerprint type (e.g., finger, palm, etc.) using fingerprint sensors 1301 and 1521, and/or displays (e.g., display 130 of FIG. 1, sub-display 152 of FIG. 1). For example, the controller 1020 (e.g., a control circuit) may recognize the fingerprint using the first sensor light source in the case that the shape of the recognized fingerprint is a finger, and it may recognize the fingerprint using the second sensor light source in the case that the shape of the recognized fingerprint is a palm.

In another embodiment, the sensor light source 1530 may also be formed on one side of the sensor PCB 1010 facing the display 1510, for example, on the front side 1010a of the sensor PCB 1010. In this case, the electronic device 100 may drive the sensor light source 1530 independently of the display 1510. Alternatively, in another embodiment, the electronic device 100 may drive the sensor light source 1530 in association with the display 1510 and, for example, may adjust the amount of light of the light source 1530 through performing an operation on the basis of the amount of light output from the display 1510.

The electronic device according to various embodiments of the present disclosure may improve user convenience by detecting a fingerprint through at least a part of the flexible display.

The electronic device according to various embodiments of the present disclosure may secure a mounting space and reduce thickness by including a fingerprint sensor capable of recognizing a fingerprint in both directions.

The descriptions of the various aspects and embodiments have been presented for purposes of illustration, but are not intended to be exhaustive or limited to the embodiments disclosed. Even though combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. An electronic device comprising:
 a foldable housing comprising:
  a hinge,
  a first housing connected to the hinge and comprising a first surface facing a first direction and a second surface facing a second direction opposite to the first direction, and
  a second housing connected to the hinge, the second housing comprising a third surface facing a third direction and a fourth surface facing a fourth direction opposite to the third direction, wherein the first housing and the second housing are foldable relative to each with respect to the hinge, and the first surface faces the third surface in a folded state and the third direction is the same as the first direction in an unfolded state;
a first display forming the first surface and the third surface and extending from the first surface to the third surface;
a second display exposed through at least a portion of the fourth surface;
a circuit board provided on at least a portion of the second housing;
a first fingerprint sensor provided on a front surface of the circuit board and configured to detect a fingerprint through at least a portion of the first display; and
a second fingerprint sensor provided on a rear surface of the circuit board opposite to the front surface and configured to detect a fingerprint through at least a portion of the second display.

2. The electronic device of claim 1, wherein the first fingerprint sensor is at least partially overlaps with the second fingerprint sensor.

3. The electronic device of claim 1, further comprising a support member provided inside the foldable housing and supporting the first display, and
wherein the support member comprises a transmission area formed between the first display and the first fingerprint sensor.

4. The electronic device of claim 3, wherein the first display comprises:
a flat portion forming the first surface or the third surface;
a bendable portion connected to the flat portion and configured to be folded toward the rear surface of the first display; and
a first flexible printed circuit board (FPCB) connected to the bendable portion,
wherein the first FPCB is connected to the circuit board by a first connecting member.

5. The electronic device of claim 4, wherein the support member further comprises a through hole formed in at least a portion between the first FPCB and the circuit board, and
wherein the first connecting member connects the first FPCB and the circuit board through the through hole.

6. The electronic device of claim 1, further comprising a second flexible printed circuit board (FPCB) connected to the second display and provided on a rear surface of the second display,
wherein the second FPCB is connected to the circuit board by a second connecting member.

7. The electronic device of claim 1, wherein the first display comprises:
a window,
a polarizing film,
a display panel,
a polymer member, and
a conductive member, and
wherein, in the first display, the polymer member and the conductive member are removed from a portion at least partially overlapping with the first fingerprint sensor.

8. The electronic device of claim 1, further comprising a control circuit provided on at least a portion of the circuit board and configured to drive the first fingerprint sensor and the second fingerprint sensor.

9. The electronic device of claim 1, wherein the circuit board comprises a sensor printed circuit board (PCB) on which a control circuit is provided, and
wherein the circuit board is connected to the sensor PCB.

10. The electronic device of claim 1, wherein the circuit board comprises a main PCB on which a control circuit is provided.

11. The electronic device of claim 10, wherein a sensor hole is formed in at least a portion of the main PCB, and
wherein the first fingerprint sensor and the second fingerprint sensor are provided on the sensor hole.

12. The electronic device of claim 1, further comprising a sensor light source provided on at least one of the front surface of the circuit board and the rear surface of the circuit board.

13. A fingerprint sensor configured to detect a fingerprint from at least two directions, the fingerprint sensor comprising:
a first fingerprint sensor provided on a front surface of a circuit board and configured to detect a fingerprint on the front surface; and
a second fingerprint sensor provided on a rear surface of the circuit board that is opposite to the front surface, and configured to detect a fingerprint on the rear surface,
wherein the first fingerprint sensor and the second fingerprint sensor are provided in a foldable electronic device of which at least a part is foldable, and
wherein at least one of the first fingerprint sensor and the second fingerprint sensor are further configured to detect the fingerprint based on light received through at least a part of the foldable electronic device from the at least two directions.

14. The fingerprint sensor of claim 13, wherein the circuit board comprises a sensor printed circuit board (PCB) of the foldable electronic device on which a control circuit is provided, and
wherein the circuit board is connected to a main PCB of the foldable electronic device.

15. The fingerprint sensor of claim 13, wherein the circuit board comprises a main PCB of the foldable electronic device on which a control circuit is provided.

* * * * *